(12) United States Patent
Cain et al.

(10) Patent No.: US 8,987,808 B2
(45) Date of Patent: Mar. 24, 2015

(54) THIN FILM TRANSISTOR WITH ACCURATELY ALIGNED ELECTRODE PATTERNS AND ELECTRONIC DEVICE(S) THAT INCLUDE SAME

(75) Inventors: Paul A. Cain, Cambridge (GB); Yong-Young Noh, Cambridge (GB); Henning Sirringhaus, Cambridge (GB)

(73) Assignees: Cambridge Enterprise Limited (GB); Plastic Logic Limited (GB)

( * ) Notice: Subject to any disclaimer, the term of this patent is extended or adjusted under 35 U.S.C. 154(b) by 1017 days.

(21) Appl. No.: 12/225,619

(22) PCT Filed: Mar. 28, 2007

(86) PCT No.: PCT/GB2007/050160
§ 371 (c)(1),
(2), (4) Date: Feb. 19, 2009

(87) PCT Pub. No.: WO2007/110671
PCT Pub. Date: Oct. 4, 2007

(65) Prior Publication Data
US 2009/0166612 A1    Jul. 2, 2009

(30) Foreign Application Priority Data

| Mar. 29, 2006 | (GB) | 0606257.4 |
| Mar. 29, 2006 | (GB) | 0606258.2 |
| Apr. 5, 2006 | (GB) | 0606773.0 |
| Dec. 6, 2006 | (GB) | 0624382.8 |
| Dec. 6, 2006 | (GB) | 0624383.6 |

(51) Int. Cl.
*H01L 29/66*    (2006.01)
*H01L 29/786*    (2006.01)
(Continued)

(52) U.S. Cl.
CPC ...... *H01L 29/78663* (2013.01); *H01L 51/0022* (2013.01); *H01L 51/0023* (2013.01);
(Continued)

(58) Field of Classification Search
None
See application file for complete search history.

(56) References Cited

U.S. PATENT DOCUMENTS 6,278,127 B1 *   8/2001   Dodabalapur et al. .......... 257/40
6,403,408 B1 *   6/2002   Green et al. ................... 438/161
(Continued)

FOREIGN PATENT DOCUMENTS

EP    1544905    6/2005
EP    1580811 A2    9/2005
(Continued)

OTHER PUBLICATIONS

Halik et al., Low-voltage organic transistors with an amorphous molecular gate dielectric, Nature vol. 431, pp. 963-966, Oct. 21, 2004.*
(Continued)

*Primary Examiner* — Andres Munoz
(74) *Attorney, Agent, or Firm* — Schwegman Lundberg & Woessner, P.A.

(57) ABSTRACT

An electronic device comprising an optically transparent substrate, a first electrode structure incorporating a channel, said channel being optically transparent and said electrode structure being optically opaque, at least one intermediate layer, and a photosensitive dielectric layer disposed above the at least one intermediate layer, the photosensitive dielectric layer incorporating a trench in a region essentially over said channel, the electronic device further comprising a further electrode, wherein the further electrode is located partially in the trench and partially beyond the trench such that portions of the further electrode that extend beyond the trench are separated from the at least one intermediate layer by the photosensitive dielectric layer.

36 Claims, 17 Drawing Sheets

(51) Int. Cl.
*H01L 51/00* (2006.01)
*H01L 51/10* (2006.01)
*H01L 51/05* (2006.01)

(52) U.S. Cl.
CPC ........ *H01L51/102* (2013.01); *H01L 29/78672* (2013.01); *H01L 51/0001* (2013.01); *H01L 51/0541* (2013.01)
USPC ................ 257/327; 257/40; 438/99; 438/197

(56) References Cited

U.S. PATENT DOCUMENTS

| | | | |
|---|---|---|---|
| 7,344,928 | B2 | 3/2008 | Wong et al. |
| 2005/0051770 | A1 | 3/2005 | Ando et al. |
| 2005/0106507 | A1 | 5/2005 | Bernds et al. |
| 2005/0151820 | A1 | 7/2005 | Sirringhaus et al. |
| 2005/0211975 | A1 | 9/2005 | Kawasaki et al. |
| 2005/0274986 | A1 | 12/2005 | Sirringhaus et al. |
| 2006/0060855 | A1 | 3/2006 | Lee et al. |
| 2006/0160272 | A1 | 7/2006 | Effenberger et al. |
| 2009/0166612 | A1* | 7/2009 | Cain et al. ........................ 257/40 |
| 2009/0212292 | A1 | 8/2009 | Hayton et al. |
| 2010/0090220 | A1 | 4/2010 | Kawasaki et al. |

FOREIGN PATENT DOCUMENTS

| | | |
|---|---|---|
| JP | 2067757 | 3/1990 |
| JP | 02-206132 A | 8/1990 |
| JP | 2003-152190 A | 5/2003 |
| JP | 2003158134 A | 5/2003 |
| JP | 2005-277238 A | 10/2005 |
| WO | WO-99/10939 A2 | 3/1999 |
| WO | WO-01/15234 A1 | 3/2001 |
| WO | WO-2004055920 | 7/2004 |
| WO | WO-2004-113419 A2 | 12/2004 |
| WO | WO-2005/022664 A2 | 3/2005 |
| WO | WO-2005022604 A | 3/2005 |
| WO | WO-2005106507 A | 11/2005 |
| WO | WO-2007110671 | 10/2007 |

OTHER PUBLICATIONS

JP 2003158134 A, machine translation, Hara et al., Published May 2003.*

"International Application No. PCT/GB2007/050160 International Search Report", 5 pgs.

"International Application No. PCT/GB2007/050160, International Preliminary Report on Patentability dated Sep. 30, 2008", 13 pgs.

"International Application No. PCT/GB2007/050160, Written Opinion mailed Oct. 29, 2007", 12 pgs.

"U.S. Appl. No. 13/621,095, Restriction Requirement mailed Sep. 13, 2013", 11 pgs.

Bao. Z., et al., "High-Performance Plastic Transistors Fabricated by Printing Techniques ", *Chem. Mater., 9,* (1997), 1299-1301.

Bao, Z., "Materials and Fabrication Needs for Low-Cost Organic Transistor Circuits", *Advanced Materials.* 12(3), (Feb. 2000), 227-230.

Brittain, Scott, "Soft Lithography and Microfabrication", *Physics World,* (May, 1998), 31-37.

Chiang, Chun-Sung, et al., "Top-Gate Staggered Amorphous Silicon Thin-Film Transistors: Series Resistance and Nitride Thickness Effects", *Jpn. J. Appl. Phys., 37,* (1998), 5914-5920.

Duan, X., et al., "High-performance thin-film transistors using semiconductor nanowires and nanoribbons", *Nature, 425,* (2003), 274-278.

Facchetti, A., et al., "Gate Dielectrics for Organic Field-Effect Transistors: New Opportunities for Organic Electronics", *Advanced Materials, 17,* (2005), 1705-1725.

Ito, H., "Dissolution behavior of chemically amplified resist polymers for 248-, 193-, and 157-nm lithography", *IBM J. Res. & Dev.,* 45(5), (Sep. 2001), 683-695.

Kagan, C. R., et al., "Organic-Inorganic Hybrid Materials as Semiconducting Channels in Thin-Film Field-Effect Transistors", *Science,* 286(5441), (1999), 945-947.

Katz, H. E., "Organic molecular solids as thin film transistor semiconductors", *J. Mater. Chem.,* 7(3), (1997), 369-376.

Laquindanum, J. C., et al., "Synthesis, Morphology, and Field-Effect Mobility of Anthradithiophenes", *J. Am. Chem. Soc.,* 120, (1998), 664-672.

Ridley, B. A., et al., "All-Inorganic Field Effect Transistors Fabricated by Printing", *Science,* 286, (1999), 746-749.

Rogers, J. A. et al., "Low-voltage 0.1 μm organic transistors and complementary inverter circuits fabricated with a low-cost form of near-field photolithography", *Applied Physics Letters,* 75(7), (1999), 1010-1012.

Sirringhaus, H., "Device Physics of Solution-Processed Organic Field-Effect Transistors", *Advanced Materials,* 17, (2005), 2411-2425.

Yoon, M.-H., et al., "sigma-pi molecular dielectric multilayers for low-voltage organic thin-film transistors", *Proc. Natl. Acad. Sci. USA,* 102(13), (2005), 4678-4682.

"U.S. Appl. No. 13/621,095, Response filed Oct. 14, 2013 to Restriction Requirement mailed Sep. 13, 2013", 13 pgs.

Machine Translation of JP2003-158134, published May 30, 2003, 39 pgs.

"U.S. Appl. No. 13/621,095, Non Final Office Action mailed Jan. 10, 2014", 22 pgs.

"U.S. Appl. No. 13/621,095, Response filed Apr. 10, 2014 to Non Final Office Action mailed Jan. 10, 2014", 26 pgs.

"Japanese Application Serial No. 2013-010912, Office Action mailed Mar. 3, 2014", with English translation of claims, 7 pgs.

"European Application Serial No. 07733583.4, Office Action mailed Oct. 20, 2009", 3 pgs.

"European Application Serial No. 07733583.4, Office Action mailed Apr. 9, 2010", 1 pg.

"European Application Serial No. 07733583.4, Office Action mailed Jun. 10, 2011", 4 pgs.

"European Application Serial No. 07733583.4, Office Action mailed Oct. 10, 2012", 3 pgs.

"European Application Serial No. 07733583.4, Response filed Jun. 10, 2010 to Office Action mailed Apr. 9, 2010", 38 pgs.

"European Application Serial No. 07733583.4, Response filed Oct. 19, 2012 to Office Action mailed Oct. 10, 2012", 4 pgs.

"European Application Serial No. 07733583.4, Response filed Nov. 16, 2011 to Office Action mailed Jun. 10, 2011", 13 pgs.

"Japanese Application Serial No. 2009-502226, Office Action mailed Jul. 30, 2012", (English Translation), 4 pgs.

"U.S. Appl. No. 13/621,095, Notice of Allowance mailed Aug. 1, 2014", 12 pgs.

* cited by examiner

THIN FILM TRANSISTOR WITH ACCURATELY ALIGNED ELECTRODE PATTERNS AND ELECTRONIC DEVICE(S) THAT INCLUDE SAME

RELATED APPLICATIONS

This application is a nationalization under 35 U.S.C. 371 of International Patent Application Ser. No. PCT/GB2007/050160, filed Mar. 28, 2007 and published on Oct. 4, 2007, as WO 2007/110671 A2 and republished as WO 2007/110671 A3, which claimed priority under 35 U.S.C. 119 to United Kingdom Patent Application Serial No. 0606257.4 filed Mar. 29, 2006, Serial No. 0606258.2 filed Mar. 29, 2006, Serial No. 0606773.0 filed Apr. 5, 2006, Serial No. 0624382.8 filed Dec. 6, 2006, and Serial No. 0624383.6 filed Dec. 6, 2006; which applications and publication are incorporated herein by reference and made a part hereof.

FIELD OF THE INVENTION

This invention relates to the fabrication of electronic devices, such as thin-film transistors, in particular thin-film transistors in which patterning techniques are used for definition of electrode patterns that need to be accurately aligned with respect to underlying electrodes. The fabrication technique is applicable to various patterning techniques, such as laser ablation patterning or solution-based, direct-write printing techniques which are not capable of forming structures with a small linewidth, and/or that cannot be positioned very accurately with respect to previously deposited patterns. We thus describe self-aligned gate techniques which are applicable for both gate patterning by a subtractive technique, in particular selective laser ablation patterning, and gate patterning by an additive technique such as printing. The techniques facilitate the use of low-resolution gate patterning.

BACKGROUND OF THE INVENTION

Thin film transistors (TFTs) are used in a variety of applications such as pixel switching transistors in active matrix displays on glass substrates, or low-cost electronic circuits, such as radiofrequency identification (RFID) tags. A conventional TFT in a top-gate architecture according to the prior art is shown in FIG. 1A. On a substrate 1 source-and drain electrodes 2 with channel length L are defined by photolithographic patterning. A semiconducting active layer island 3 is defined by depositing the active semiconductor as a continuous layer and subsequently patterning it. A gate dielectric layer 4 is then deposited. Finally a gate electrode 5 is deposited and patterned on top in another photolithography step.

The switching performance and speed of the TFT is critically determined by the parasitic capacitances $C_{gs}$ and $C_{gd}$ between the gate electrode and the source/drain electrodes, respectively. This is determined by the channel width W, channel length L, and geometric overlap s between gate and source/drain electrodes and should be kept as small as possible. For optimum performance for a given channel length L it is important that the gate electrode only covers the channel itself, and does not overlap significantly with the source and drain electrodes themselves. In order to minimize s so-called self-aligned gate processes can be used where the patterning is performed in such a way that the gate electrode is automatically aligned with respect to the channel without requiring precise alignment between the source-drain pattern and the gate pattern.

In order to achieve cost reduction and enable manufacturing on flexible substrate, such as plastic substrates, manufacturing processes based on alternative patterning techniques such as solution-based printing and laser ablation have been used. These are particularly applicable for material sets based on organic semiconductors, such as solution-processible polymer semiconductors or small molecule organic semiconductors, or solution-processible inorganic semiconductors, such as inorganic nanoparticles or nanowires. One of the common drawbacks of such manufacturing techniques is that the realization of self-aligned electrodes and small linewidths is much more challenging.

Another draw back of the large overlap area that is present with non-self-aligned gate electrodes (including printed gate electrodes) is that the device is susceptible to pinhole or particle defects in the gate dielectric located in the active area of the device. The gate dielectric needs to be thin in order to enable a large ON current of the TFT, but the larger the overlap area of the device the more likely it is that a defect will cause a short between electrodes on the gate and the source-drain level. This is particularly important on flexible plastic substrate for which typical substrate quality is not as high, and particle defect density not as low as on conventional glass substrates.

There are several low-cost manufacturing methods in the prior art for gate patterning. These include both selective laser ablation patterning (SLAP) and direct-write printing processes.

According to one low-cost manufacturing method in the prior art gate patterning is achieved by selective laser ablation patterning (SLAP). This technique is disclosed in an earlier patent, (see GB0513915.9), the entire content of which is included in the present application by way of reference, allowing patterning by laser ablation of metallic layers on upper layers of a device without radiation induced damage of lower, underlying layers.

The technique of SLAP is a method of producing fine features of a device using short pulse lasers for the fabrication of thin film transistor (TFT) structures. This technique incorporating laser ablation uses a single shot per imaging area of a short pulse laser to pattern layers of metallic material on top of underlying layers in order to produce fine features of a TFT device. An example is the patterning of a gold gate electrode of a top-gate organic TFT with underlying gate dielectric, active semiconductor and conducting source-drain electrode layers. This technique may be performed without destroying or substantially degrading the performance of these sensitive elements, such as the semiconductor layer and the source-drain electrodes. This is due to the short pulse length allowing all of the energy of an ultra-short laser beam to enter the material and to be absorbed within the layer to be ablated which will result in the act of ablation before any substantial thermalization actually occurs, that can lead to degradation/ablation of underlying layer. In addition, this technique may be used to finely tune the source and drain electrode formation after a coarser laser ablation process, resulting in the substantial elimination of burring edges that could lead to electrical shorts.

The SLAP technique is capable of producing linewidths on the order of 10-20 µm or lower, i.e., significantly narrower than what is achievable with printing techniques. For top exposure accurate alignment of the SLAP patterned layer with respect to underlying layers requires precise alignment of the laser ablation mask with respect to the previously patterned layer, which is challenging to do on a distorted, flexible substrate.

According to an alternative low-cost TFT manufacturing method in the prior art (see for example, US20050274986) a thin film transistor is manufactured by a direct-write printing process. On a substrate a first source electrode and a second drain electrode are patterned by inkjet printing followed by deposition of semiconducting and dielectric layers. The channel length L between the source and drain electrodes is defined, for example, by printing the two electrodes sufficiently far apart from each other or by using surface energy patterns to direct the flow of ink on the substrate (US20050274986). In this way channel lengths of several microns or tens of microns can be defined. In US20050151820—the content of which is included in the present document by way of reference—in order to realize shorter channel lengths a self-aligned printing (SAP) process was demonstrated (FIG. 8). The surface 48 of the first source electrode 47 is prepared such that it is repulsive to the ink of the second electrode 49. As a result the ink is repelled by the surface of the first electrode, flows off the pattern of the first electrode, and dries in close proximity but not in physical contact with the first electrode. In this way it is possible to define channel lengths on the order of 100 nm by inkjet printing.

After deposition of the semiconductor layer 50 and dielectric 51 the gate electrode 52 is printed subsequently and has a relatively large linewidth of typically 50-100 μm due to the difficulties of dispensing small liquid volumes with present day printing technologies. Therefore, for both micron scale channel lengths as well as for submicrometer channel length fabricated by techniques such as SAP the geometric overlap s between the source/drain and gate electrodes is very large, and the parasitic capacitance of such a TFT is large in spite of the small channel length. In the case of submicrometer source-drain electrodes fabricated by SAP this parasitic capacitance limits the switching speed of the TFTs, and prevents making full use of the short channel length realized in these devices.

Methods for realizing self-aligned printed gates have been proposed in WO05022664, but these rely on confining the ink of the gate electrode to the region above the channel and require precise control of ink and surface properties in order to confine a large ink volume onto a narrow line. In the case of micrometer or even submicrometer channel length this is very challenging.

BRIEF SUMMARY OF THE INVENTION

The present invention provides a method by which a self-aligned gate for a transistor can be produced using various patterning techniques including, for example, a subtractive processes such as the SLAP patterning technique, or a printing technique, even if the patterning technique used for patterning the gate electrode is not capable of producing a linewidth that is comparable to that of the channel length, and/or cannot be aligned accurately with respect to the source-drain electrode structure.

According to a first aspect of the present invention, there is provided an electronic device comprising a substrate, a first electrode structure incorporating a channel, at least one intermediate layer, and a photosensitive dielectric layer disposed above the at least one intermediate layer, the photosensitive dielectric layer incorporating a trench in a region essentially over said channel; the electronic device further comprising a further electrode, wherein the further electrode is located at least partially in the trench such that any portions of the further electrode that extend beyond the trench are separated from the at least one intermediate layer by the photosensitive dielectric layer.

The electronic device of the present invention therefore provides a reliable way of ensuring that the further electrode is accurately positioned over the channel to ensure that the device can function properly while at the same time providing separation of the further electrode from the intermediate layer to help overcome problems associated with parasitic capacitance and particle and/or pinhole defects.

The trench is in a region essentially over the channel. In essence, the trench is located over the channel and preferably matches the shape of the channel. The trench can result from the removal of some or all of the photosensitive dielectric layer over the channel. Preferably the dimensions of the trench accurately match the channel and allow the further electrode to be fully formed above or over the channel thereby forming an efficient electronic device.

Preferably, the first electrode structure comprises a source and a drain electrode structure separated by said channel region; and/or the at least one intermediate layer comprises a first dielectric or semiconducting layer; and/or the further electrode is a gate electrode.

This allows for the formation of various electronic devices including thin film transistors (TFTs) or diodes.

According to a preferred embodiment, the electronic device comprises a further semiconducting layer located on the opposite side of said intermediate layer from said photosensitive dielectric layer.

Preferably, the thickness of the photosensitive dielectric layer is greater than the thickness of the intermediate layer and particularly preferably, the photosensitive dielectric layer has a thickness of between 500 nm and 10 μm and/or the intermediate layer is less than 1 μm thick. In addition, the first dielectric or semiconductor layer may have a thickness of between 10 to 500 nm.

As stated above, the trench significantly thins the photosensitive dielectric layer above the channel. This can help to ensure that the device works efficiently. More of the photosensitive dielectric layer can be removed such that the trench substantially removes the photosensitive dielectric layer above the channel.

The device can be made from various materials. For example, the photosensitive dielectric layer can be a positive photoresist, such as SHIPLEY® 1813 positive UV photoresist. The first dielectric layer may be formed from a polymer dielectric, such as polyisobutylene, polyvinylphenol, polymethylmethacrylate (PMMA), parylene or polystyrene (PS). In one embodiment, the first dielectric layer comprises a multilayer stack. However, all suitable materials for the photosensitive dielectric layer and the first dielectric layer are encompassed by the present invention.

The thickness of the first dielectric layer versus the channel length may be altered to affect the properties of the device. Preferably, the thickness of the first dielectric layer is less than the channel length between the first electrode structure. More preferably, the thickness of the first dielectric layer is less than half the channel length between the first electrode structure, and more preferably is less than one fourth the channel length between the first electrode structure, even more preferably is less than one tenth the channel length between the first electrode structure.

Preferably, the channel between the first electrode structure is of micrometer or sub micrometer length. In addition, it is preferred that the linewidth of said further electrode is wider than said channel, and/or said trench.

According to a particularly preferred embodiment, the adhesion properties of the at least one intermediate layer are different to the adhesion properties of the photosensitive dielectric layer. This provides advantageous properties to the device. One advantage is that it allows regions of the upper layers to be selectively removed without the need for photomasks since regions will not adhere as strongly to the device allowing for easy formation of further layers or formation of the device itself.

This is particularly useful when ablating the upper electrode so that it is substantially formed within the trench. Ablation will take place from the photosensitive dielectric layer but will not take place (or will take place to a lesser degree) from the surface of the intermediate layer. This will result in formation of the upper electrode substantially within the trench. This may be useful to ensure that the upper electrodes are patterned in a suitable way on the upper surface of the device.

Preferably the adhesion properties of the at least one intermediate layer and/or the photosensitive dielectric layer are adjusted using surface modification techniques such as exposure to chemical, physical or plasma treatments. However any technique to adjust the surfaces relative to each other are encompassed by the present invention. Preferably, the adhesion properties of the at least one intermediate layer are higher than the adhesion properties of the photosensitive dielectric layer. Particularly preferred is when the at least one intermediate layer is a first dielectric layer.

Thus, preferably, the at least one intermediate layer is a first dielectric layer.

According to a preferred embodiment, the electronic device comprises an additional patterned photoresist layer on top of the patterned photosensitive dielectric layer.

Particularly preferred, the electronic device comprises an additional patterned photoresist layer on top of the patterned photosensitive dielectric layer, such that a photolithographic process can be used to form the further electrode.

The first electrode structure can be made from a variety of materials and all suitable materials are encompassed by the present invention. In particular, the first electrode structure may comprise inorganic metals, such as gold, copper, aluminium, palladium, nickel; or the first electrode structure comprises an organic conducting polymer such as polyethylenedioxythiophene doped with polystyrene sulfonate (PEDOT/PSS).

According to a preferred embodiment, the electronic device may comprise more than one first electrode structure.

It is possible that the further electrode fills the trench in the photosensitive dielectric layer. Portions of the further electrode may overflow onto the upper surface of the photosensitive dielectric layer. The further electrode can be made from a variety of materials and all suitable materials are encompassed by the present invention. In particular, the further electrode may comprise inorganic metals, such as gold, copper, aluminium, palladium, nickel; or the further electrode structure comprises an organic conducting polymer such as polyethylenedioxythiophene doped with polystyrene sulfonate (PEDOT/PSS).

According to a preferred embodiment, if the further electrode is made by a subtractive technique, the thickness of the further electrode may be selected such that it can be patterned in a single shot exposure by selective laser ablation patterning (SLAP).

Alternatively, the further electrode may be formed by printing of a conductive material. This can be done by any suitable printing method. A preferable printing method is inkjet printing. The further electrode may be formed from a nanoparticle metal or conducting polymer solution/dispersion. It is possible for the conducting material of the first electrode structure and/or the further electrode to be formed from a printable dispersion of colloidal metal nanoparticles that can be converted into a high conductivity metal structure on a substrate by thermal or laser annealing.

The semiconductor layer can be made from a variety of materials and all suitable materials are encompassed by the present invention. In particular, the semiconductor layer may comprise an organic semiconductor, such as, polyarylamine, polyfluorene, polythiophene-based semiconducting polymers or a small molecule semiconductor such as pentacene or rubrene; or the semiconductor comprises an inorganic semiconductor, such as vacuum deposited amorphous or polycrystalline silicon, or solution-deposited inorganic nanomaterials, such as colloidal nanoparticles or nanowires.

The substrate can be made from a variety of materials and all suitable materials are encompassed by the present invention. In particular, the substrate may be a rigid substrate such as, a glass or silicon substrate or a flexible substrate such as a plastic substrate or a flexible metal foil, optionally comprising suitable planarisation, passivation or encapsulation layers.

The electronic device of the present invention may find many uses. In particular, the electronic device may be a diode or a transistor, such as a thin film transistor. The electronic device may be incorporated into a logic circuit, gate array, memory device, interconnect, capacitor, resistor, monitor or display device and such devices are encompassed by the present invention.

The present invention also provides a method of producing an electronic device, the device comprising an optically transparent substrate, a pre-defined first electrode structure incorporating an optically transparent channel, at least one intermediate layer and a photosensitive dielectric layer disposed above the at least one intermediate layer, the method comprising patterning a trench structure in a region of the photosensitive dielectric layer over the channel by backside light exposure through said optically transparent substrate using the pre-defined first electrode structure as a mask and subsequent removal of at least part of the photosensitive dielectric layer from such exposed regions such that when a further electrode is formed at least partially within the trench, the photosensitive dielectric layer ensures that any portions of the further electrode that extend beyond the trench are separated from the at least one intermediate layer by the photosensitive dielectric layer.

The device comprises optically transparent regions. The term optically transparent is intended to encompass a region that allows at least a portion of light (of any form including visible, UV or IR) through such that patterning can occur. The method uses backside light exposure. This means that the substrate and the channel should allow at least a sufficient amount of the relevant light through it to pattern the photosensitive dielectric layer.

Backside light exposure means passing light through the reverse side of the device. In essence, light is passed though the substrate and the channel into the photosensitive dielectric layer.

The method proves a simple and effective way to form electronic devices. Preferably, the first electrode structure comprises a source and a drain electrode structure separated by said channel region; and/or the at least one intermediate layer comprises a first dielectric layer and/or a second semiconducting layer; and/or the further electrode is a gate electrode. Particularly preferably, the device comprises a further semiconducting layer located on the opposite side of said intermediate layer from said photosensitive dielectric layer Preferably, the light used to pattern the trench structure is UV, visible or infrared. This allows for simple and effective patterning of the trench.

Preferably, at least one edge of said trench is located within 5 μm of an edge of said first electrode, and particularly preferably, at least one edge of said trench is located within 1 μm of an edge of said first electrode.

According to a preferred embodiment, a coarse shadow mask comprising light transmissive and light blocking regions is used to shield certain regions of the photosensitive layer away from the first electrodes of the device that would otherwise be exposed to the light. It is possible that the electronic device further comprises upper interconnects on the same level as the further electrode or on a higher level. If this is the case then it is preferably that the coarse shadow mask is used to shield from light exposure the area in which such interconnects cross with the first electrode structure or with interconnects on the same level or on a lower level than the first electrode.

According to one preferred embodiment, a subtractive patterning technique is used to form the further electrode from an upper conductive layer. Any suitable patterning technique is encompassed by the present invention but includes photolithography or selective laser ablation patterning (SLAP). In a preferred embodiment, the further electrode is formed by single shot selective laser ablation patterning.

Preferably, a shaped beam either in the form of a focussed, scanned beam or a beam projected onto the substrate through a photomask is used to pattern the further electrode.

As stated above for the electronic device, it is possible for the adhesion properties of the at least one intermediate layer and/or the photosensitive dielectric layer to be adjusted. Preferably, the adhesion of the further electrode layer to the intermediate layer is adjusted to be higher than the adhesion of the further electrode layer to the photosensitive dielectric layer, such that during the SLAP patterning the further electrode layer is removed from at least portions of the photosensitive dielectric layer but not from regions within the trench. The removal of the further electrode layer attached to the photosensitive dielectric layer will occur faster than the further electrode layer attached to the intermediate layer in the trench. Therefore, while removal may occur from both regions the overall net effect is selective removal from the region outside the trench rather than unselective removal. Preferably, the adhesion properties of the further electrode layer with the at least one intermediate layer and/or the photosensitive dielectric layer are adjusted using surface modification techniques such as exposure to chemical, physical or plasma treatments.

Various sources can be used to form the further electrode. One source is an excimer laser, preferably at a wavelength such as 248 nm, 308 nm, 351 nm, or 193 nm.

According to a particularly preferred embodiment, an additive patterning technique may be used to form the further electrode. This may be a printing technique. Any suitable patterning technique is encompassed by the present invention but includes inkjet printing, offset printing, gravure printing, flexographic printing or screen printing. Preferably the gate electrode conducting material is deposited onto the layer from the liquid phase and dried.

There are various ways in which the first electrode structure is formed. All possible methods are encompassed by the present invention but include methods where the first electrode structure is formed on a substrate either additively by a process such as direct printing including inkjet, gravure, offset, flexographic or screen printing or shadow mask evaporation, laser transfer patterning or subtractively by a process such as photolithography, laser ablation, embossing, stamping or soft lithography. For applications where a submicrometer channel length is required a particularly preferred technique for defining the first electrode structure is self-aligned printing (US2005015820).

Preferably, the conducting material of the first electrode structure is opaque for the light used to pattern the trench in said photosensitive dielectric layer. This allows the first electrode structure to perform effectively as a mask.

Preferably, the trench significantly thins the photosensitive dielectric layer above the channel. Alternatively, the trench substantially removes the photosensitive dielectric layer above the channel. The trench will be such that the further electrode can be placed at a suitable distance from the first electrode structure.

Preferably the surface of the photosensitive dielectric layer is exposed to a surface conditioning such as an oxygen plasma treatment prior to the deposition of the further electrode. In addition, or alternatively, an additional layer can be deposited on top of the patterned photosensitive layer, such as an adhesion layer prior to deposition of the further electrode.

Formation of the trench can be controlled by various parameters, for example the dimensions of the trench are controlled by the exposure conditions, the developing time, the properties of the resist material employed, and/or by the optical properties of the layer structure. It may also be possible for the dimensions of the trench to be controlled by the thickness profile of the first electrode structure, in particular by the profile near the edge of the first electrode structure. In this instance, a thick edge to the first electrode structure could be used to give a narrower trench and a thin edge of the first electrode structure could be used to give a broader trench.

The method is applicable to electronic devices using the materials stated above. However, any suitable materials are encompassed by the present invention. In particular, the semiconductor layer may comprise an organic semiconductor, such as, polyarylamine, polyfluorene, polythiophene-based semiconducting polymers or a small molecule semiconductor such as pentacene or rubrene; or the semiconductor comprises an, inorganic semiconductor, such as vacuum deposited amorphous or polycrystalline silicon, or solution-deposited inorganic nanomaterials, such as colloidal nanoparticles or nanowires.

The semiconductor layer, first dielectric layer and/or photosensitive dielectric layer may be formed by any appropriate method. These include printing, inkjet printing, soft lithographic printing, screen printing, offset printing, blade coating, dip coating, spin coating, curtain coating, meniscus coating, spray coating, extrusion coating, or the layer(s) are deposited as a thin continuous film and patterned subtractively by techniques such as photolithography or laser ablation.

Preferably the photosensitive dielectric layer has a thickness of between 500 nm and 10 μm and/or the intermediate layer is less than 1 μm thick. Preferably the first dielectric layer has a thickness of between 1 to 500 nm.

More preferably the first dielectric layer has a thickness of between 10 to 500 nm. Preferably, the first dielectric is a solution-deposited polymer dielectric. According to a preferred embodiment of the present invention the first dielectric layer is a crosslinked polymer dielectric layer, as described, for example, in Facchetti et al., Adv. Mat. 17, 1705 (2005). Crosslinked polymer dielectrics enable very thin pinhole-free films with thicknesses below 50 nm that are difficult to achieve without forming a cross-linked network of chains, and are robust against dissolution during any of the subsequent solution deposition and development steps. Alternatively, the first gate dielectric might be a self-assembled monolayer dielectric (Halik, Nature 431, 963 (2004)).

The present method may provide an electronic device where the capacitance measured between said further electrode and said first electrode is lower than that would be measured between the further electrode and the first electrode if the photosensitive dielectric layer was absent.

The present invention encompasses electronic devices made according to the method described herein. In particular the present invention encompasses an electronic device comprising a self-aligned gate made by a method described herein. The present invention encompasses a transistor, thin film transistor, diode, logic circuit, gate array, memory device, interconnect, capacitor, resistor, monitor or display device comprising an electronic device made by a method disclosed herein.

Thus, according to a particular embodiment, the invention further provides a method for producing a self-aligned gate for a transistor comprising a first gate dielectric layer and a photosensitive dielectric wherein a trench structure is defined in the photosensitive dielectric the position of which is self-aligned with the transistor channel by backside light exposure through the pattern of pre-defined source-drain electrodes, and wherein a gate electrode is defined by a subtractive processes such as selective laser ablation patterning. In particular the gate electrode is defined such that any portions of the gate electrode that might extend beyond the trench are separated from the active first gate dielectric by the photosensitive dielectric layer.

The invention further provides a device fabricated using a method according to an aspect of the invention.

BRIEF DESCRIPTION OF THE DRAWINGS

Preferred embodiments of the present invention will now be described with reference to the following figures.

DETAILED DESCRIPTION OF THE INVENTION

The device fabrication techniques of the present invention are applicable to various gate formation methods. It is possible to form the top gate either additively or subtractively. Subtractive methods include laser ablation and additive methods include printing. The invention disclosed herein encompasses both techniques. In one preferred embodiment an additive technique is used. In an alternative preferred embodiment, a subtractive technique is used.

Figure 1A:
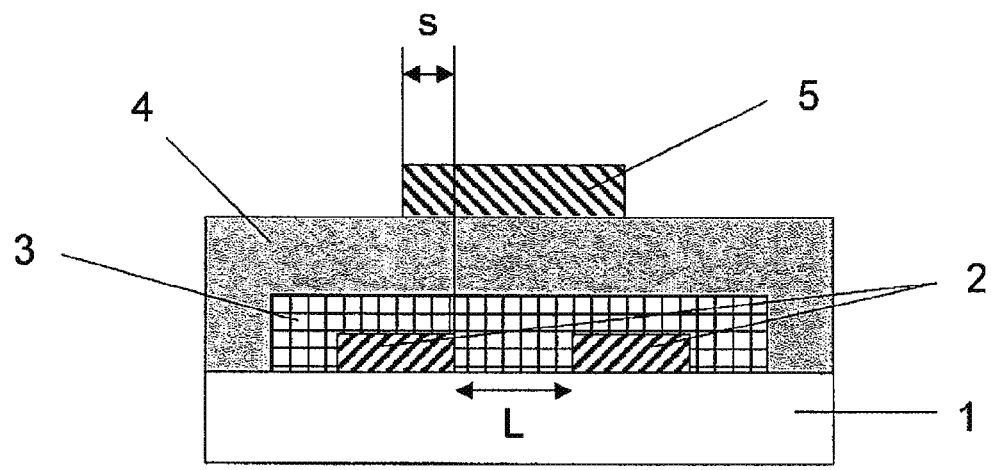
FIG. 1A shows a top-gate TFT structure according to the prior art without the self-aligned gate.
Figure 1B:
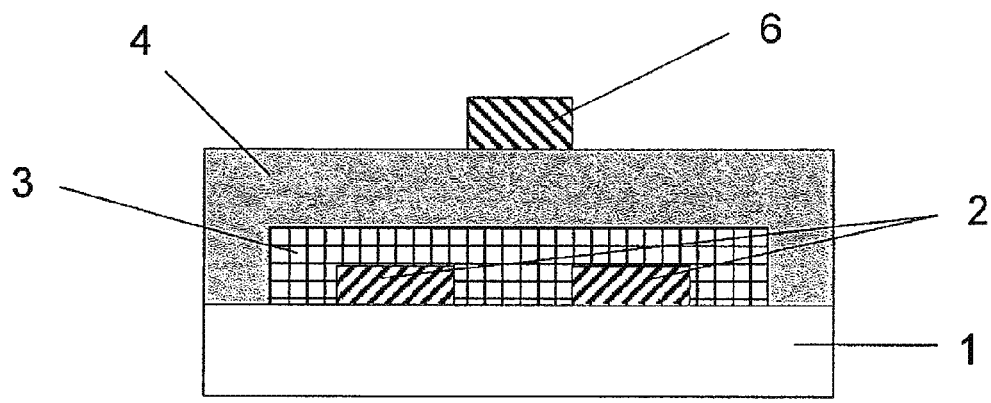
FIG. 1B shows a top-gate TFT structure with the self-aligned gate.

The switching performance and speed of the TFT is critically determined by the parasitic capacitances $C_{gs}$ and $C_{gd}$ between the gate electrode and the source/drain electrodes, respectively. This is determined by the channel width W, channel length L, and geometric overlap s between gate and source/drain electrodes and should be kept as small as possible. For optimum performance for a given channel length L it is important that the gate electrode only covers the channel itself, and does not overlap significantly with the source and drain electrodes themselves. In order to minimize s so-called self-aligned gate processes can be used where the patterning is performed in such a way that the gate electrode is automatically aligned with respect to the channel without requiring precise alignment between the source-drain pattern 2 and the gate pattern 6 (FIG. 1B).

In a conventional TFT manufacturing process, a self-aligned gate can be achieved by performing the light exposure for the gate photolithography through the back of the substrate such that the photoresist is only exposed in the channel region but not directly on top of the source and drain electrodes. By using the source and drain electrodes as a mask in this way the gate metal 6 (FIG. 1B) can be patterned to be present only directly on top of the channel itself, i.e. it is self-aligned with respect to the source-drain electrodes.

Figure 2:
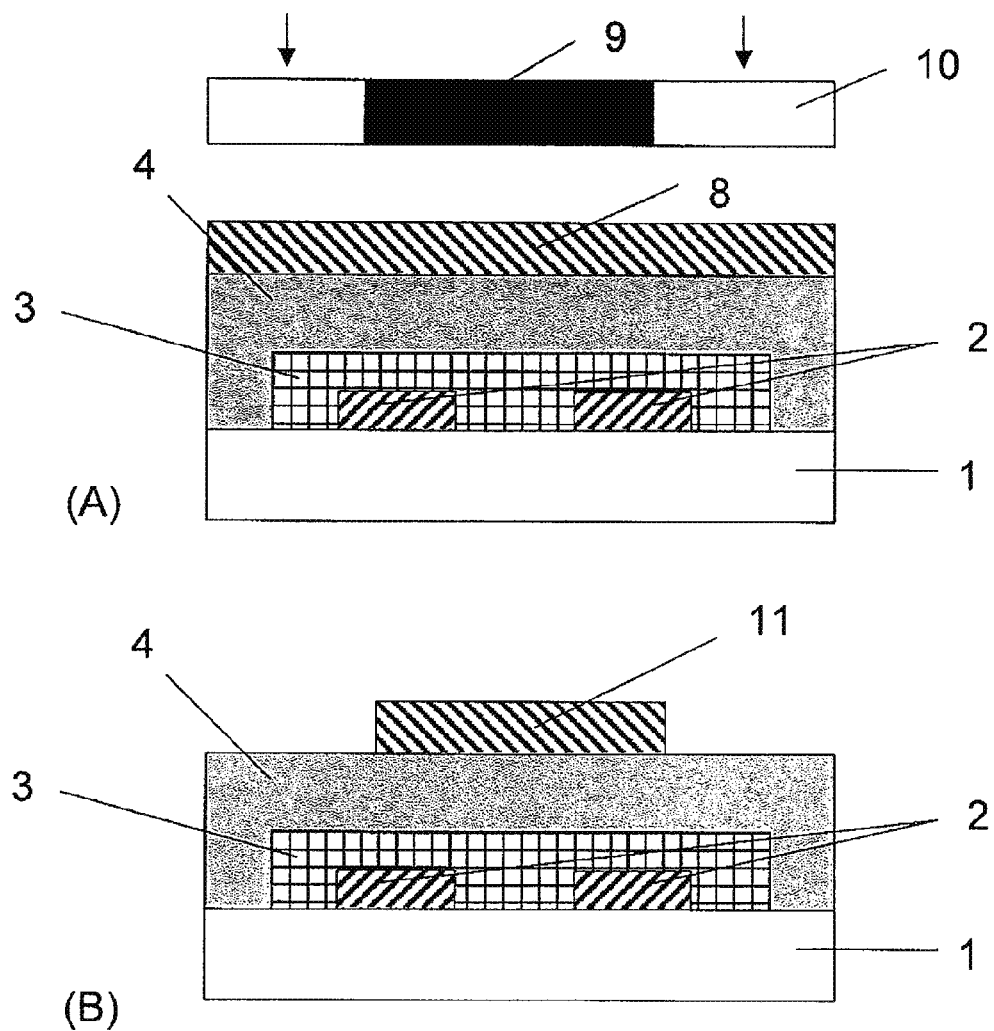
FIG. 2 illustrates the manufacturing process for a top-gate TFT with a gate electrode fabricated by the SLAP technique.

A specific embodiment of the selective laser ablation patterning (SLAP) technique is illustrated in FIG. 2. On a substrate 1 comprising a set of source-drain electrodes 2, a semiconducting layer 3, and a gate dielectric 4 a thin metal layer 8 is deposited by a continuous film deposition technique. A single shot of a pulsed laser beam is used in order to selectively remove portions of this upper conductive layer 8 of the TFT. The laser beam can be shaped with the help of a photomask containing light transmissive regions 10 and light blocking regions 9. Alternatively, a scanned focussed laser beam can be used. The upper conductive layer efficiently absorbs the laser radiation and is removed entirely from the substrate in a single short. It shields the underlying layers from the radiation, such that the underlying layers are not removed, damaged or degraded even if such layers are metallic as well, and/or absorb the laser radiation strongly. In this way the gate electrode on top of a multilayer structure can be patterned by laser ablation without damage to any of the underlying layers.

Considering first a subtractive technique for the top gate formation, a method according to an embodiment of the present invention is based on the use of a multilayer gate dielectric on top of a source-drain electrode structure with channel length L. The patterning of the source-drain structure can be performed by any technique such as but not limited to photolithography, shadow mask evaporation, printing, laser ablation, laser transfer patterning, embossing, stamping, soft lithography. After patterning/deposition of the source-drain electrodes 2 and semiconducting active layer 3 a first dielectric material 12 is deposited in contact with the semiconducting material of the device (FIG. 3A). The first dielectric is chosen for optimum performance of the transistor, i.e. its thickness is sufficiently thin that the required transconductance of the device is reached, while ensuring that the leakage current through the dielectric is sufficiently small. A material is selected which forms a suitable interface structure with the semiconducting material, such that the device exhibits a high field-effect mobility. The first dielectric may also comprise a multilayer of dielectric layers comprising, for example a sequence of low k and high k dielectrics.

On top of the first dielectric layer a second dielectric 13 is deposited. This dielectric is a photosensitive material which can be patterned by exposure to light of a suitable wavelength. After deposition of the second dielectric material the substrate is exposed to light through the back of the substrate in order to define a pattern of the second dielectric materials with edges aligned to the edges of the source-drain electrodes. The source-drain electrodes are selected to be sufficiently thick and optically opaque that during the backside light exposure the photosensitive dielectric material is only exposed to light in the region of the channel, and away from the electrodes but not on top of the electrodes. The light exposure is preferably performed through a suitably designed and coarsely aligned shadow mask with light transmissive and light blocking regions 14 and 15, respectively, to shield certain regions of the photosensitive layer away from the electrodes of the transistors that would otherwise be exposed to the light. In this a self-aligned pattern in the second dielectric layer is created with a trench region 16 over the channel of the device in which the second dielectric layer is removed or at least thinned significantly.

Figure 4:
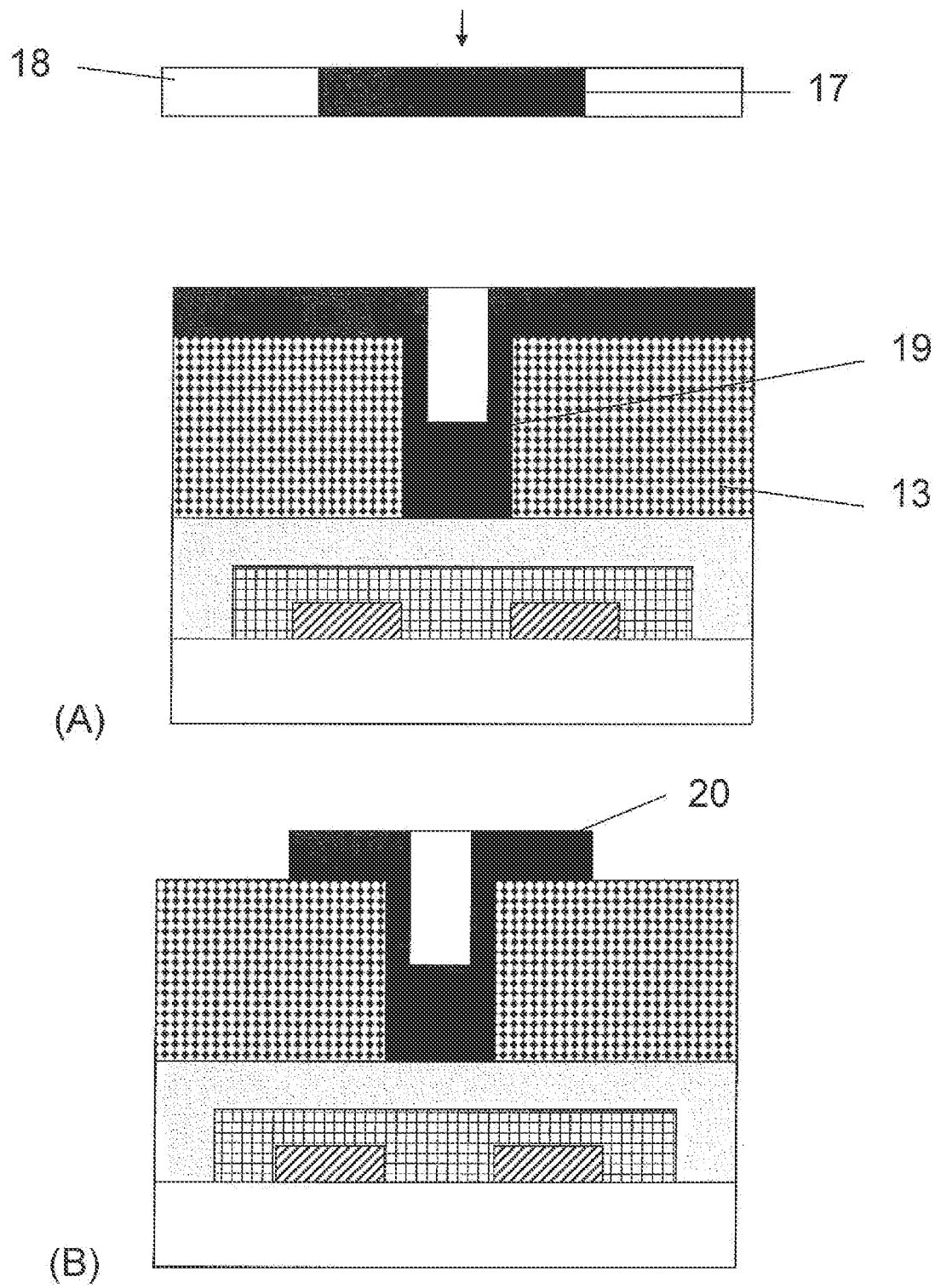
FIG. 4 illustrates the final gate patterning step for a top-gate TFT with a self-aligned gate fabricated by the SLAP technique according to an embodiment of the present invention.

Then the gate metal 19 is deposited as a continuous film onto the substrate, typically from vapour phase by techniques such as, but not limited, evaporation or sputtering (FIG. 4). Alternatively, solution-based film coating techniques can also be used. The metal film is sufficiently thin that it can be patterned in a single shot exposure by SLAP in a subsequent step. This can be achieved by exposing the substrate to laser irradiation through a shadow mask comprising light blocking regions 17 and light transmissive regions 18. The metal layer is only ablated underneath the light-transmissive regions of the mask. Alternatively, a focussed, scanned laser beam might be used. We note that since the light is blocked from the channel region of the device, laser exposure occurs only in the regions in which the second dielectric is thick, the process is robust against radiation-induced damage of the underlying thin gate dielectric, semiconducting and conducting layers.

For the low-cost SLAP-based patterning processes being considered here the linewidth of the gate electrode pattern 20 is larger than that of L, and the edges of the gate electrode metallization pattern cannot easily be aligned with respect to the channel, particularly on flexible substrates. This is because in order to ensure that the gate electrode overlaps with the TFT channel for all devices on a large-area distorted substrate, it is necessary to design in a suitable safety overlap which ensure that even if the position of the underlying channel is distorted, there will still be sufficient geometric overlap to ensure that the gate electrode is able to control the entire channel of the TFT.

In a TFT configuration according to the prior art this built-in overlap would lead to a significant increase in the overlap capacitance. However, in a method according to an embodiment of the present invention since the gate dielectric is much thicker over the electrode regions than over the active channel due to the self-aligned patterning of the second photosensitive dielectric this overlap does not result in a significant parasitic capacitance. In fact, the parasitic capacitance of the device can be minimized by making the thickness of the second dielectric layer sufficiently large without affecting adversely the transconductance, since the transconductance is primarily affected by the thickness of the first dielectric layer.

A method according to an embodiment of the present invention is able to form a self-aligned gate electrode with associated low parasitic capacitance for SLAP-based gate patterning technique even for substrates with large distortion which necessitate the linewidth of the SLAP gate pattern to be significantly larger than the channel length L.

Embodiments of the invention employing a subtractive technique for top gate formation will now be described in detail in the following examples.

Example 1

Mask-Based Self-Aligned Gate Patterning by Selective Laser Ablation Patterning

Figure 3:
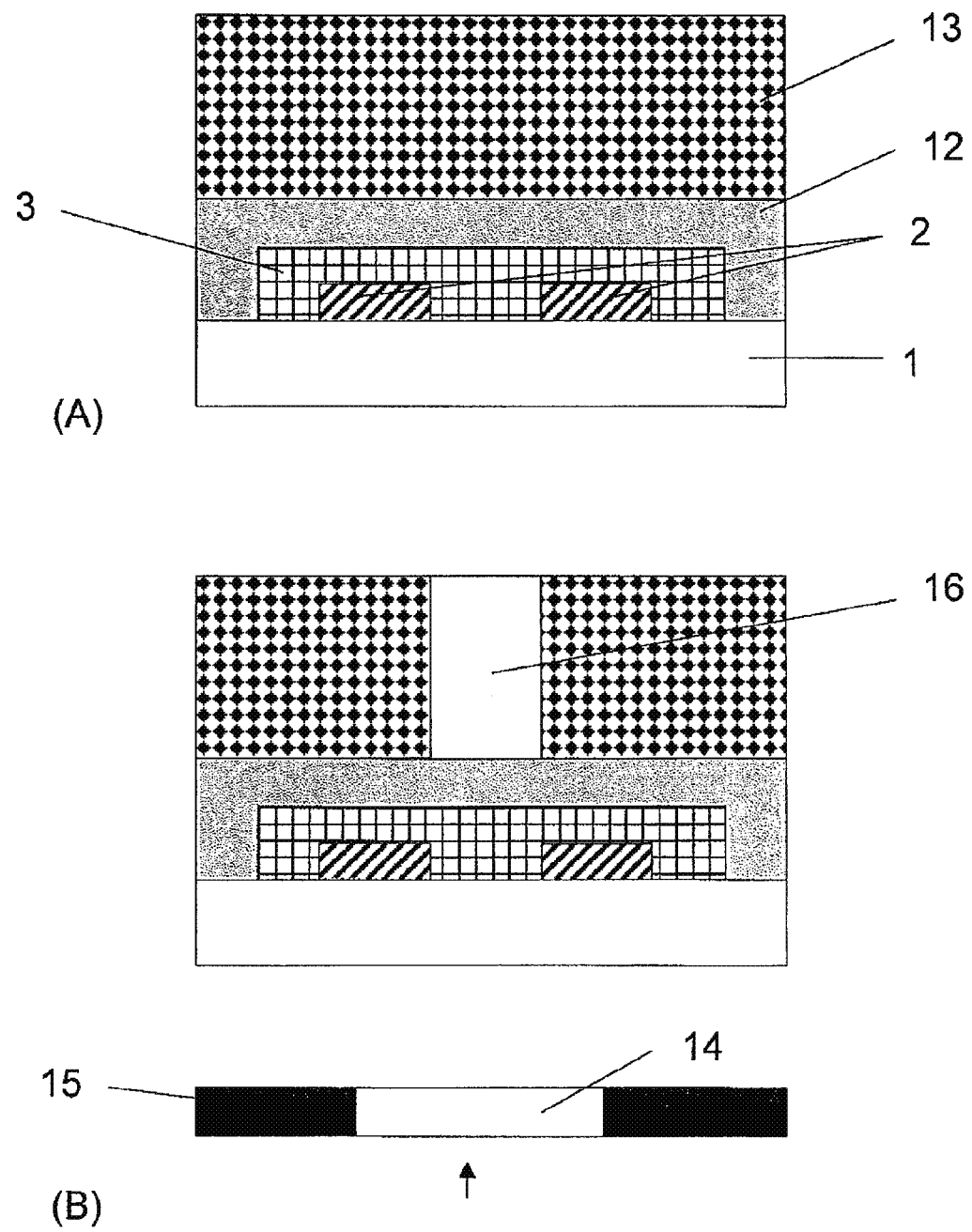
FIG. 3 illustrates the initial manufacturing process steps for a top-gate TFT with a self-aligned gate fabricated by the SLAP technique according to an embodiment of the present invention.

On a substrate 1 a pattern of source-drain electrodes 2 as well as interconnect lines is defined (FIG. 3). The substrate can be a rigid substrate such as, but not limited to, a glass or silicon substrate or a flexible substrate such as a plastic substrate or a flexible metal foil. The substrate may comprise suitable planarisation, passivation or encapsulation layers. The substrate and any of the layers on top need to be selected in order to be transparent at the wavelength of light to which the photosensitive dielectric layer is to be exposed. For standard UV light exposure plastic substrates such as PET substrates and glass substrates exhibit sufficient transparency. The source-drain electrodes comprise a conducting material, such as inorganic metals, for example, gold, copper, aluminium, palladium, nickel, or an organic conducting polymer such as polyethylenedioxythiophene doped with polystyrene sulfonate (PEDOT/PSS). The conducting material can be deposited either from vacuum phase or from solution. Patterning of the conducting materials can be either subtractively, for example, by photolithographic patterning or additively by direct printing techniques, such as, but not limited to inkjet, gravure, offset or screen printing. Preferably, the source-drain pattern is fabricated by photolithography. The thickness of the source-drain electrodes is selected such that the electrodes are sufficiently opaque at the wavelength of light that is used for the subsequent backside light exposure of the photosensitive material. In the case of an inorganic metal, such as gold a typical film thickness of 30-100 nm is suitable.

Once the conductive layer has been patterned to form the source and drain electrodes, a layer of semiconducting material 3 is then deposited over the substrate and patterned electrodes. The semiconducting layer may comprise an organic semiconductor, such as, but not limited to, polyarylamine, polyfluorene or polythiophene-based semiconducting polymers or small molecule semiconductors such as pentacene or rubrene. Alternatively, inorganic semiconductors, such as vacuum deposited amorphous or polycrystalline silicon, or solution-deposited inorganic nanomaterials, such as colloidal nanoparticles or nanowires can be used.

In the case of solution processed semiconductors a broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, blade coating or dip coating, curtain coating, meniscus coating, spray coating, or extrusion coating. Alternatively, the semiconducting layer may be deposited as a thin continuous film and patterned subtractively by techniques such as photolithography (see WO 99/10939) or laser ablation.

A first layer of gate dielectric material 12 is then deposited onto the layered substrate. The first gate dielectric layer is selected such that the device exhibits optimum device performance in terms of field-effect mobility, gate leakage current and transistor OFF current, threshold voltage and subthreshold slope as well as environmental and operational stability. The selection of the first dielectric is according to criteria known in the prior art (see for example, H. Sirringhaus, Adv. Mat. 17, 1 (2005)). A suitable choice of dielectric in combination with a polymer semiconductor such as poly-dioctylfluorene-co-bithiophene (F8T2), poly-3-hexylthiophene (P3HT) or polytriarylamine (PTAA) is polyisobutylene or polyvinylphenol, but preferably polymethylmethacrylate (PMMA) and polystyrene (PS) are used. Alternatively, the first dielectric layer may be a self-assembled monolayer deposited on the surface of the underlying layer (Klauk, Nature 431, 963 (2004); Yoon, Proceedings of the National Academy of Sciences 102, 4678 (2005)). A general review of possible dielectric layers compatible with organic semiconductors is given in Facchetti, Adv. Mat. 17, 1705 (2005). Preferably, the first dielectric material is deposited from solution, and care is taken that the solvent for the deposition of the first dielectric is selected such as to avoid swelling and dissolution of the semiconducting layer underneath (US2005274986). The dielectric material may be deposited in the form of a continuous layer, by techniques such as, but not limited to, spin-, spray or blade coating, or direct printing such as inkjet, gravure, offset or screen printing. Alternatively, more than one dielectric layer may be deposited to form a dielectric stack, for example a combination of a low-k interfacial dielectric to achieve a high field-effect mobility, and a higher-k dielectric to achieve a sufficient dielectric capacitance for a given thickness.

The thickness of the first gate dielectric layer is chosen sufficiently thin in order for the device to meet basic device scaling requirement. The thickness of the first gate dielectric layer is preferably chosen to be less than the channel length L of the transistor. More preferably the thickness of the gate dielectric is chosen to be less than half the channel length. Most preferably, the dielectric thickness is chosen to be less than one fourth of the channel length. In this way short channel effects that deteriorate the current voltage characteristics, and lead for example to a lack of saturation of the output characteristics of the transistor and reduced circuit gain, can be minimized.

Subsequently, a second photosensitive dielectric material 13 is deposited as a continuous film over the first gate dielectric layer. The second photosensitive dielectric material is preferably a positive photoresist, which can be removed selectively from the substrate in regions where the material has been exposed to light using a suitable developing process. The photosensitive dielectric material is preferably deposited from solution by a large-area coating technique such as spin coating, spray or blade coating. For example, a layer of standard SHIPLEY® 1813 positive UV photoresist can be used. Alternatively, other positive photoresists know in the prior art might also be used. An overview over possible positive photoresist materials is given in H. Ito, IBM J. Res. & Dev. 45, 683 (2001). Other photosensitive dielectrics that change their solubility characteristics upon light exposure, such that they can be removed selectively in exposed regions of the substrate might also be used.

Subsequently, the substrate is exposed to light through the backside of the substrate (FIG. 3B) such that the predeposited source-drain electrode structure acts as a self-aligned photomask. In this way the photosensitive dielectric material 13 is exposed to light only in the channel region, but is protected from light exposure on top of the source-drain electrodes. Preferably, light of UV wavelength is used for the exposure in combination with conventional UV photoresists. Alternatively, visible or infrared light might be used in combination with photoresists which are sensitive in this spectral range. The exposed photosensitive material is then developed in a suitable developer solution which removes the material in the exposed regions of the substrate. The solvent composition of the developing solution is selected such that the underlying second gate dielectric layer is not dissolved or removed in this step. In the case of SHIPLEY® 1813 photoresist, and a first gate dielectric layer of crosslinked PMMA MF319 developing solution can be used. In this way a pattern of trenches 16 is defined in the second dielectric layer the position of which is self-aligned to that of the underlying channel region, and at the bottom of which the underlying first gate dielectric layer is exposed.

The topographic profile of the trench structure is determined by the properties of the resist material employed, the profile of the source-drain electrodes and by the optical properties of the layer structure. Light scattering by the source-drain electrodes, or within any of the layers tends to broaden the width of the trench. If the thickness of the source-drain electrodes diminishes towards the edge of the channel, there might be a region near the edge of the channel where the electrodes are not fully opaque, and light can be transmitted through the thin edge of the electrode. The degree to which this happens can be controlled by controlling the edge profile of the source-drain electrodes (see further discussion below).

The deposition of the dielectric layer is then followed by the deposition of a gate electrode 19 and interconnect lines. The gate electrode may comprise a thin film of inorganic metal such as gold or a cheaper metal such as copper. The thickness of the gate electrode layer is selected so that the layer is removable in a single-shot laser exposure (as was earlier described with reference to the SLAP techniques disclosed in GB0513915.9). The selective ablation process described below is more easily achieved for thin layers of metal than for thick layers. However, in many cases a minimum layer thickness is required in order to reach the necessary conductance. For a gold layer a thickness of 50 nm provides a useful conductance for a range of applications, including gate interconnections for flat panel displays. The gate electrode may be deposited using techniques such as sputtering or evaporation techniques or solution processing techniques such as spin, dip, blade, bar, slot-die, gravure, offset or screen printing. The deposition conditions for the gate electrode are selected to fill the trench structure in the second photosensitive dielectric material and ensure high yielding electrical interconnections between the gate electrode in the trench and the gate interconnected running across the thick regions of the photosensitive dielectric material. (FIG. 4A)

The metallic layer 19 is then ablated using a 248 nm excimer laser such as the Lumonics PM800 lasers (300 mJ, 30 W), although other wavelengths can also be used, including other common excimer wavelengths such as 308 nm, 351 nm, 193 nm. The exposure pattern is defined with a shadow mask with opaque regions 17 blocking the light above the TFT channel, and light transmissive regions 18. The upper layer of the preferred gold material is removed upon firing a single shot from the laser, without any damage to the underlying metallic layers or the dielectric layer and, in addition, very little debris is formed. The process window is large when only a single shot is fired. For example a range of fluence from 28 to 112 mJ $cm^{-2}$ may be used to remove the upper gold layer without any apparent damage to the underlying layers. This results in a clean process without the formation of excess debris. This range of fluence is related to the absorption coefficient, thickness and adhesion of the upper metal layers.

The thickness of the second photosensitive dielectric material is selected to minimize the contribution to the source-drain to gate overlap capacitance from the regions in which the gate line extends beyond the trench defined in the second dielectric material. The overlap capacitance is determined by a first contribution from the thin region of the first gate dielectric material on top of the channel/at the bottom of the trench and second contribution from the adjacent regions in which the gate electrode is located on top of the second dielectric layer. The thicker the second dielectric layer can be made the lower is the second contribution to the parasitic overlap capacitance. On the other hand the thickness of the second dielectric layer is limited by mechanical adhesion as well as the need to achieve a high yield for trench filling. Preferably the thickness of the second dielectric material is on the order of 500 nm-10 µm.

For the present self-aligned gate device structure a low contact resistance for charge injection from the source and drain electrodes into the semiconducting layer is required. For semiconductor/metal combinations for which a significant contact resistance is present current crowding effects usually occur in device architectures where the gate electrode overlaps with the source-drain electrodes and the accumulation layer extends from the channel into the region above the contacts (Chiang, Jap. J. Appl. Phys. 37, 5914 (1998)). In such structures some of the current can be injected away from the edge of the source-drain metal electrodes leading to an effective lengthening of the channel and lowering of the contact resistance compared to the situation where most of the current needs to be injected right at the edge of the contacts. In the self-aligned gate architecture disclosed here current crowding effects are limited by the low density of accumulated charge in the thick dielectric regions adjacent to the trench structure, and therefore it is more important to select the source-drain contacts to exhibit a low contact resistance. In the case of organic semiconductors contact resistance effects can be reduced by choosing a metal electrode with a work function that is closely matched to the ionisation potential and electron affinity, respectively, of the semiconductor or by suitable physical or chemical contact modification.

The degree of geometrical overlap between the trench and the source and drain electrodes can be controlled with the thickness profile of the first electrode structure. If the first electrode remains opaque right to the edge of the channel the overlap is minimal. Larger overlap can be realized by producing a first electrode structure which thins towards the edge of the channel and becomes effectively semi-transparent at some distance from the edge of the channel. The latter structure might be desirable for semiconducting materials in which the contact resistance needs to be reduced with the help of current crowding effects (see discussion below).

A method according to an embodiment of the present invention is able to form a self-aligned gate electrode with associated low parasitic capacitance for SLAP-based gate patterning technique even for substrates with large distortion which necessitate the linewidth of the SLAP gate pattern to be significantly larger than the channel length L.

Example 2

Maskless Self-Aligned Gate Patterning Using Selective Laser Ablation Patterning

Figure 5:
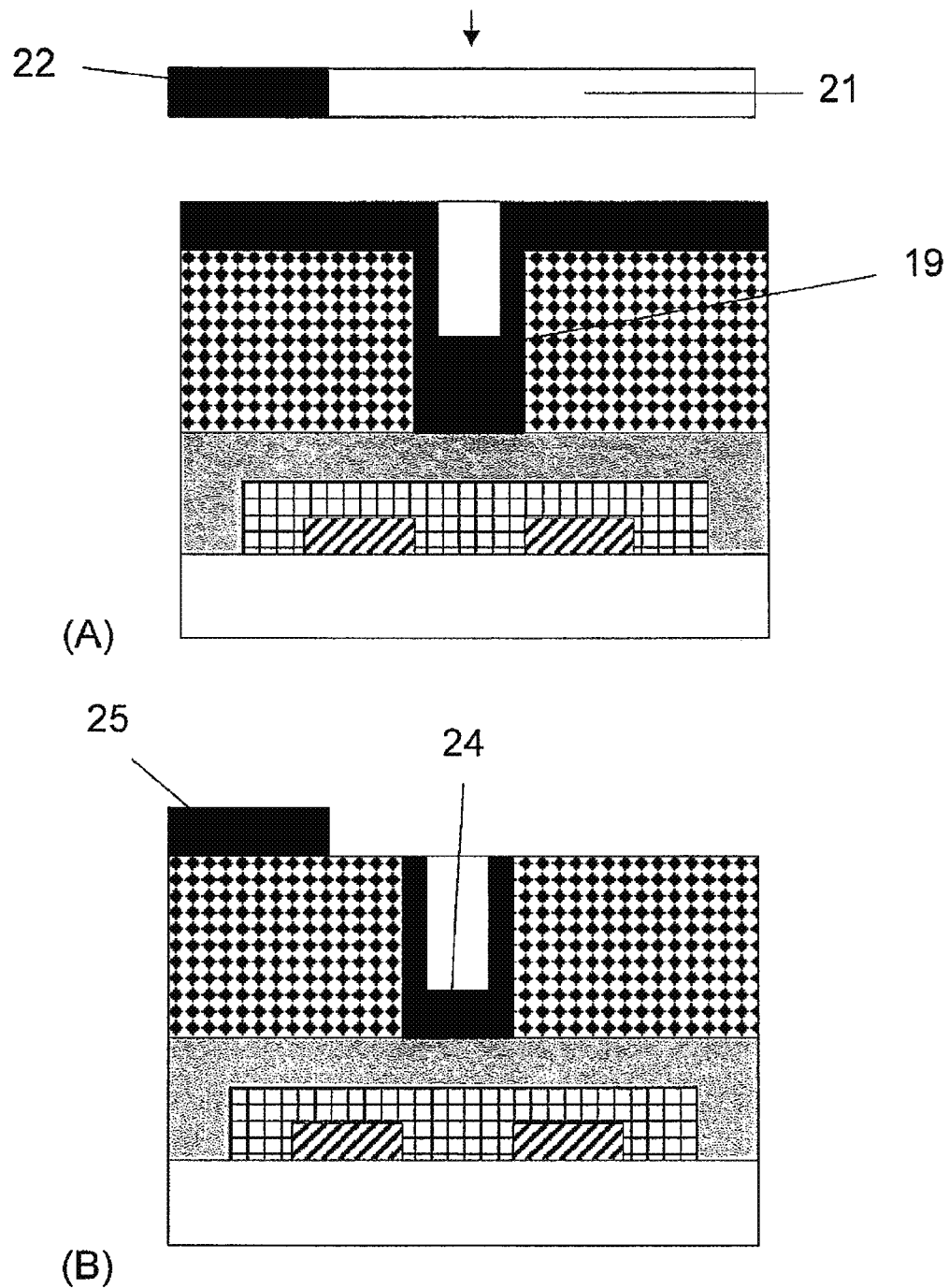
FIG. 5 illustrates an alternative method for self-aligned gate patterning of a top-gate TFT using the SLAP technique according to an embodiment of the present invention.

On a substrate 1 a pattern of source-drain electrodes 2 as well as interconnect lines is defined (FIG. 5). The substrate can be a rigid substrate such as, but not limited to, a glass or silicon substrate or a flexible substrate such as a plastic substrate or a flexible metal foil. The substrate may comprise suitable planarisation, passivation or encapsulation layers. The substrate and any of the layers on top need to be selected in order to be transparent at the wavelength of light to which the photosensitive dielectric layer is to be exposed. For standard UV light exposure plastic substrates such as PET substrates and glass substrates exhibit sufficient transparency. The source-drain electrodes comprise a conducting material, such as inorganic metals, for example, gold, copper, aluminium, palladium, nickel, or an organic conducting polymer such as polyethylenedioxythiophene doped with polystyrene sulfonate (PEDOT/PSS). The conducting material can be deposited either from vacuum phase or from solution. Patterning of the conducting materials can be either subtractively, for example, by photolithographic patterning or additively by direct printing techniques, such as, but not limited to inkjet, gravure, offset or screen printing. Preferably, the source-drain pattern is fabricated by photolithography. The thickness of the source-drain electrodes is selected such that the electrodes are sufficiently opaque at the wavelength of light that is used for the subsequent backside light exposure of the photosensitive material. In the case of an inorganic metal, such as gold a typical film thickness of 30-100 nm is suitable.

Once the conductive layer has been patterned to form the source and drain electrodes, a layer of semiconducting material 3 is then deposited over the substrate and patterned electrodes. The semiconducting layer may comprise an organic semiconductor, such as, but not limited to, polyarylamine, polyfluorene or polythiophene-based semiconducting polymers or small molecule semiconductors such as pentacene or rubrene. Alternatively, inorganic semiconductors, such as vacuum deposited amorphous or polycrystalline silicon, or solution-deposited inorganic nanomaterials, such as colloidal nanoparticles or nanowires can be used.

In the case of solution processed semiconductors a broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, blade coating or dip coating, curtain coating, meniscus coating, spray coating, or extrusion coating. Alternatively, the semiconducting layer may be deposited as a thin continuous film and patterned subtractively by techniques such as photolithography (see WO 99/10939) or laser ablation.

A first layer of gate dielectric material 12 is then deposited onto the layered substrate. The first gate dielectric layer is selected such that the device exhibits optimum device performance in terms of field-effect mobility, gate leakage current and transistor OFF current, threshold voltage and subthreshold slope as well as environmental and operational stability. The selection of the first dielectric is according to criteria known in the prior art (see for example, H. Sirringhaus, Adv. Mat. 17, 1 (2005)). A suitable choice of dielectric in combination with a polymer semiconductor such as poly-dioctylfluorene-co-bithiophene (F8T2), poly-3-hexylthiophene (P3HT) or polytriarylamine (PTAA) is polyisobutylene or polyvinylphenol, but preferably polymethylmethacrylate (PMMA) and polystyrene (PS) are used. Preferably, the first dielectric material is deposited from solution, and care is taken that the solvent for the deposition of the first dielectric is selected such as to avoid swelling and dissolution of the semiconducting layer underneath (US2005274986). The dielectric material may be deposited in the form of a continuous layer, by techniques such as, but not limited to, spin-, spray or blade coating, or direct printing such as inkjet, gravure, offset or screen printing. Alternatively, more than one dielectric layer may be deposited to form a dielectric stack, for example a combination of a low-k interfacial dielectric to achieve a high field-effect mobility, and a higher-k dielectric to achieve a sufficient dielectric capacitance for a given thickness.

The thickness of the first gate dielectric layer is chosen sufficiently thin in order for the device to meet basic device scaling requirement. The thickness of the first gate dielectric layer is preferably chosen to be less than the channel length L of the transistor. More preferably the thickness of the gate dielectric is chosen to be less than half the channel length. Most preferably, the dielectric thickness is chosen to be less than one fourth of the channel length. In this way short channel effects that deteriorate the current voltage characteristics, and lead for example to a lack of saturation of the output characteristics of the transistor and reduced circuit gain, can be minimized.

Subsequently, a second photosensitive dielectric material 13 is deposited as a continuous film over the first gate dielectric layer. The second photosensitive dielectric material is preferably a positive photoresist, which can be removed selectively from the substrate in regions where the material has been exposed to light using a suitable developing process. The photosensitive dielectric material is preferably deposited from solution by a large area coating technique such as spin coating, spray or blade coating. For example, a layer of standard SHIPLEY® 1813 positive UV photoresist can be used. Alternatively, other positive photoresists know in the prior art might also be used. An overview over possible positive photoresist materials is given in H. Ito, IBM J. Res. & Dev. 45, 683 (2001). Other photosensitive dielectrics that change their solubility characteristics upon light exposure, such that they can be removed selectively in exposed regions of the substrate might also be used.

Subsequently, the substrate is exposed to light through the backside of the substrate such that the predeposited source-drain electrode structure acts as a self-aligned photomask. In this way the photosensitive dielectric material 13 is exposed to light only in the channel region, but is protected from light exposure on top of the source-drain electrodes. Preferably, light of UV wavelength is used for the exposure in combination with conventional UV photoresists. Alternatively, visible or infrared light might be used in combination with photoresists which are sensitive in this spectral range. The exposed photosensitive material is then developed in a suitable developer solution which removes the material in the exposed regions of the substrate. The solvent composition of the developing solution is selected such that the underlying second gate dielectric layer is not dissolved or removed in this step. In the case of SHIPLEY® 1813 photoresist, and a first gate dielectric layer of PMMA MF319 developing solution can be used. In this way a pattern of trenches 16 is defined in the second dielectric layer the position of which is self-aligned to that of the underlying channel region, and at the bottom of which the underlying first gate dielectric layer is exposed.

The topographic profile of the trench structure is determined by the properties of the resist material employed, the profile of the source-drain electrodes and by the optical properties of the layer structure. Light scattering by the source-drain electrodes, or within any of the layers tends to broaden the width of the trench. If the thickness of the source-drain electrodes diminishes towards the edge of the channel, there might be a region near the edge of the channel where the electrodes are not fully opaque, and light can be transmitted through the thin edge of the electrode. The degree to which this happens can be controlled by controlling the edge profile of the source-drain electrodes.

The deposition of the dielectric layer is then followed by the deposition of a gate electrode 19 and interconnect lines. The gate electrode may comprise a thin film of inorganic metal such as gold or a cheaper metal such as copper. The thickness of the gate electrode layer is selected so that the layer is removable in a single-shot laser exposure (as was earlier described with reference to the SLAP techniques disclosed in GB0513915.9). The selective ablation process described below is more easily achieved for thin layers of metal than for thick layers. However, in many cases a minimum layer thickness is required in order to reach the necessary conductance. For a gold layer a thickness of 50 nm provides a useful conductance for a range of applications, including gate interconnections for flat panel displays. The gate electrode may be deposited using techniques such as sputtering or evaporation techniques or solution processing techniques such as spin, dip, blade, bar, slot-die, gravure, offset or screen printing. The deposition conditions for the gate electrode are selected to fill the trench structure in the second photosensitive dielectric material (FIG. 4A)

The metallic layer 19 is then ablated using a 248 nm excimer laser such as the Lumonics PM800 lasers (300 mJ, 30 W), although other wavelengths can also be used, including other common excimer wavelengths such as 308 nm, 351 nm, 193 nm. In this second embodiment of the invention—in contrast to the first embodiment—the light is not blocked from the channel region of the TFT. We have found that the adhesion properties of the metal to the underlying dielectric layers can be adjusted such that the metallic layer 19 ablates on the surface of the photosensitive dielectric 13 to which it is weakly adhering, whereas a stronger adhesion of the metal layer to the bottom of the gate dielectric layer ensures that the metallic layer 24 is not ablated in the bottom of the trench.

To achieve the desired adhesion contrast, it is possible to construct both the first gate dielectric layer and the photosensitive dielectric layer as a multilayer structure which allows to optimise adhesion properties from the other required properties as outlined above. Also, surface modification processes, such as exposure to chemical, physical or plasma treatments might be used.

The ablation threshold of 50 nm Cu on a 500 nm Parylene-C film has been measured to be >200 mJ/cm^2, whereas the ablation threshold of 50 nm Cu on a 50 nm PVP film or on a 500 nm S1813 photoresist film is ~80 mJ/cm^2. An example of a selective ablation process using these materials is as follows: a first dielectric layer of parylene-C is applied to a substrate, followed by a 500 nm photosensitive layer of S1813 photoresist which is exposed to the relevant pattern and developed as standard. A thin (50 nm) copper layer is then sputtered onto the parylene/photoresist layer. A single pulse of a 248 nm excimer laser (pulse length ~30 ns) is then used per image area, with a fluence of around 100 mJ/cm^2. Those areas of copper in contact with the photoresist are delaminated (ablated) and removed from the surface, whereas those areas of copper in contact with the parylene are not removed.

In the weakly adhering regions the metallic layer is removed upon firing a single shot from the laser, without any damage to the underlying metallic layers or the dielectric layer and, in addition, very little debris is formed.

In this embodiment the gate electrode is confined to the narrow trench self-aligned with the channel, and the parasitic capacitance is at a minimum irrespective of the thickness of the photosensitive dielectric layer.

To connect the gate electrode inside the narrow trench to interconnects, and to define interconnects 25 and other features located on top of the thick photosensitive dielectric layer it is possible to employ a photomask with light blocking regions 22 for the SLAP patterning. Electrical connections to the metallic layer in the trench 24 can be made, for example, designing a light-blocking contact area in the photomask which overlaps with a portion of the self-aligned trench. Alternatively, electrical connections to the metallic layer in the trench 24 might be formed by filling a portion of the trench structure with a conducting materials, such as inkjet printing of a metallic ink or a conducting polymer in a subsequent process step.

It is possible to initiate the differential adhesion contrast self-aligned with the channel in alternative ways. If the capacitance reduction for interconnects which is achieve by using a thick photosensitive dielectric layer is not required, the photosensitive dielectric layer might be replaced for example by a self-assembled monolayer (SAM) which attaches to the first gate dielectric layer, and weakens the adhesion of the metallic layer to the first gate dielectric layer. The SAM is selected such, that it can be removed from the substrate by suitable light exposure, for example UV photoexposure breaking bonds between the molecule and the substrate.

For the present self-aligned gate device structure a low contact resistance for charge injection from the source and drain electrodes into the semiconducting layer is required. For semiconductor/metal combinations for which a significant contact resistance is present current crowding effects usually occur in device architectures where the gate electrode overlaps with the source-drain electrodes and the accumulation layer extends from the channel into the region above the contacts (Chiang, Jap. J. Appl. Phys. 37, 5914 (1998)). In such structures some of the current can be injected away from the edge of the source-drain metal electrodes leading to an effective lengthening of the channel and lowering of the contact resistance compared to the situation where most of the current needs to be injected right at the edge of the contacts. In the self-aligned gate architecture disclosed here current crowding effects are limited by the low density of accumulated charge in the thick dielectric regions adjacent to the trench structure, and therefore it is more important to select the source-drain contacts to exhibit a low contact resistance. In the case of organic semiconductors contact resistance effects can be reduced by choosing a metal electrode with a work function that is closely matched to the ionisation potential and electron affinity, respectively, of the semiconductor or by suitable physical or chemical contact modification.

The degree of geometrical overlap between the trench and the source and drain electrodes can be controlled with the thickness profile of the first electrode structure. If the first electrode remains opaque right to the edge of the channel the overlap is minimal. Larger overlap can be realized by producing a first electrode structure which thins towards the edge of the channel and becomes effectively semi-transparent at some distance from the edge of the channel. The latter structure might be desirable for semiconducting materials in which the contact resistance needs to be reduced with the help of current crowding effects (see discussion below).

A method according to an embodiment of the present invention is able to form a self-aligned gate electrode with associated low parasitic capacitance for SLAP-based gate patterning technique even for substrates with large distortion which necessitate the linewidth of the SLAP gate pattern to be significantly larger than the channel length L.

Example 3

Figure 6:
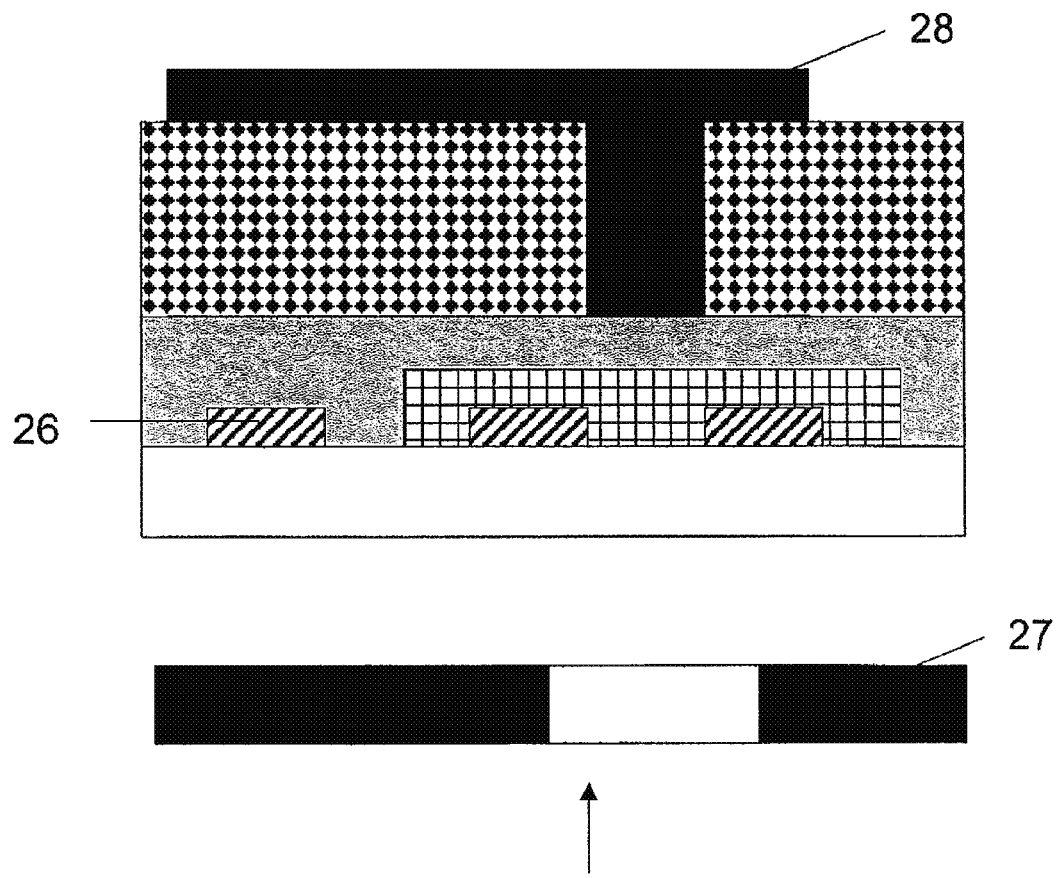
FIG. 6 illustrates a manufacturing process for a top-gate TFT with a self-aligned gate electrode fabricated by the SLAP technique and low capacitance interconnect overlap regions according to an embodiment of the present invention.

Self-Aligned Gate Patterning Using SLAP with Low-Capacitance Interconnect Overlap Regions A method according to an embodiment of the present invention can also be used to minimize the parasitic capacitance due to overlap between interconnect lines located on the gate level and interconnects located on the level of the source-drain electrodes. This is shown in FIG. 6. On the level of the source-drain electrode a data or interconnect line 26 is defined. This data line may be used to apply a voltage or current signal to one or more of the TFTs of the circuit. On the gate level there are similar interconnect lines 28 which might interconnect several of the TFTs, or be used to apply a voltage signal to one or more of the TFT gates. In the region in which the two interconnect lines 26 and 28 overlap a parasitic capacitor is created, which can be a significant factor limiting the switching performance of the TFT circuit, particularly in the case of wide interconnect lines, as is usually the case with interconnect lines defined by low-cost patterning techniques. In a standard TFT configuration where the interconnects and gate electrodes to the TFT are located on the same level, the dielectric layer which defines the parasitic overlap capacitance of the interconnect lines is the same as the gate dielectric layer, and therefore the parasitic overlap capacitance is large.

According to a further embodiment of the present invention the mask pattern 27 of light exposure which defines the trenches in the photosensitive dielectric layer is selected such that the light is blocked in the region in which the interconnects 26 and 28 overlap. In this way a thick dielectric is present in the region of overlap minimizing the overlap capacitance. This ensures that the regions of overlap between the interconnections have a much thicker dielectric than the gate dielectric of the TFTs ensuring low parasitic capacitance and optimum circuit switching speed.

The processes and devices described herein are not limited to devices fabricated with solution-processed polymers. Some of the conducting electrodes of the TFT and/or the interconnects in a circuit or display device (see below) may be formed from inorganic conductors, that are able to, for example, be deposited by the printing of a colloidal suspension or by electroplating onto a pre-patterned substrate. In devices where not all of the layers deposited from solution, one or more PEDOT/PSS portions of the device may be replaced with an insoluble conductive material such as a vacuum-deposited conductor.

Possible materials that may be used for the semiconducting layer, includes any solution processible conjugated polymeric or oligomeric material that exhibits adequate field-effect mobilities exceeding $10^{-3}$ cm$^2$/Vs and preferably exceeding $10^{-2}$ cm$^2$/Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors based on, for example, colloidal nanoparticles (B. A. Ridley, et al., Science 286, 746 (1999)) or inorganic semiconductor nanowires (X. Duan, Nature 425, 274 (2003)). Alternatively, vacuum-deposited semiconductors comprising thin-film, amorphous or polycrystalline silicon can be used.

Although preferably all layers and components of the device and circuit are deposited and patterned by solution processing and printing techniques, one or more components may also be deposited by vacuum deposition techniques and/or patterned by photolithographic processes.

Devices such as TFTs fabricated as described above may be part of more complex circuits or devices, in which one or more such devices can be integrated with each other and/or with other devices. Examples of applications include logic circuits and active matrix circuitry for a display or a memory device, or a user-defined gate array circuit.

Patterning processes, as described above, may also be used to pattern other circuitry components, such as, but not limited to, interconnects, resistors and capacitors.

Figure 7:
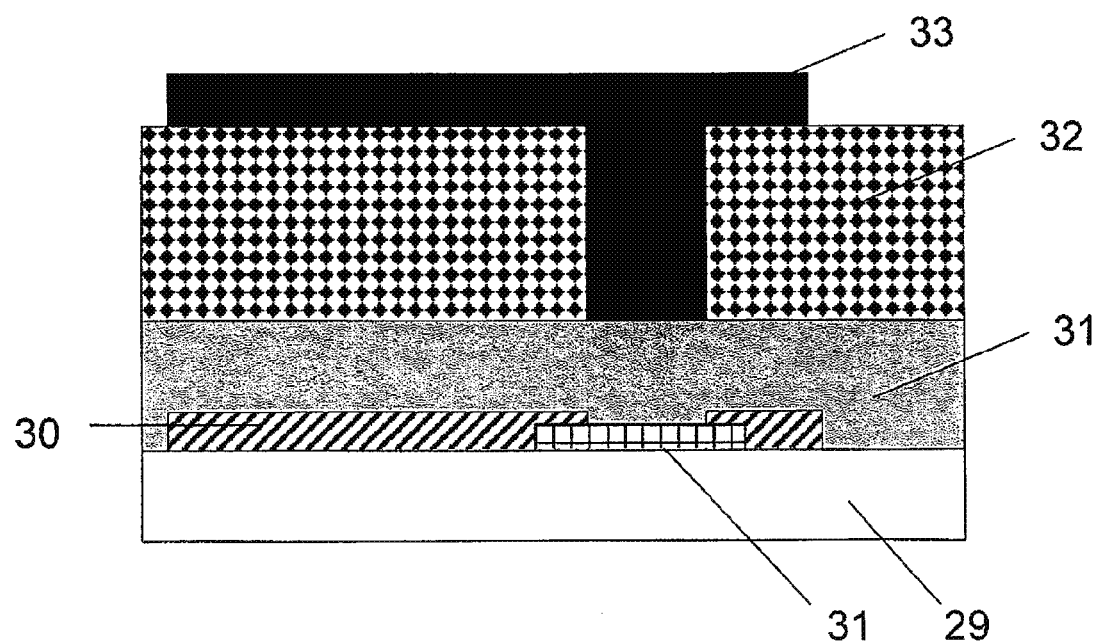
FIG. 7 shows an alternative embodiment of the present invention applied to the fabrication of a low capacitance diode structure with a self-aligned cathode.
Figure 8:
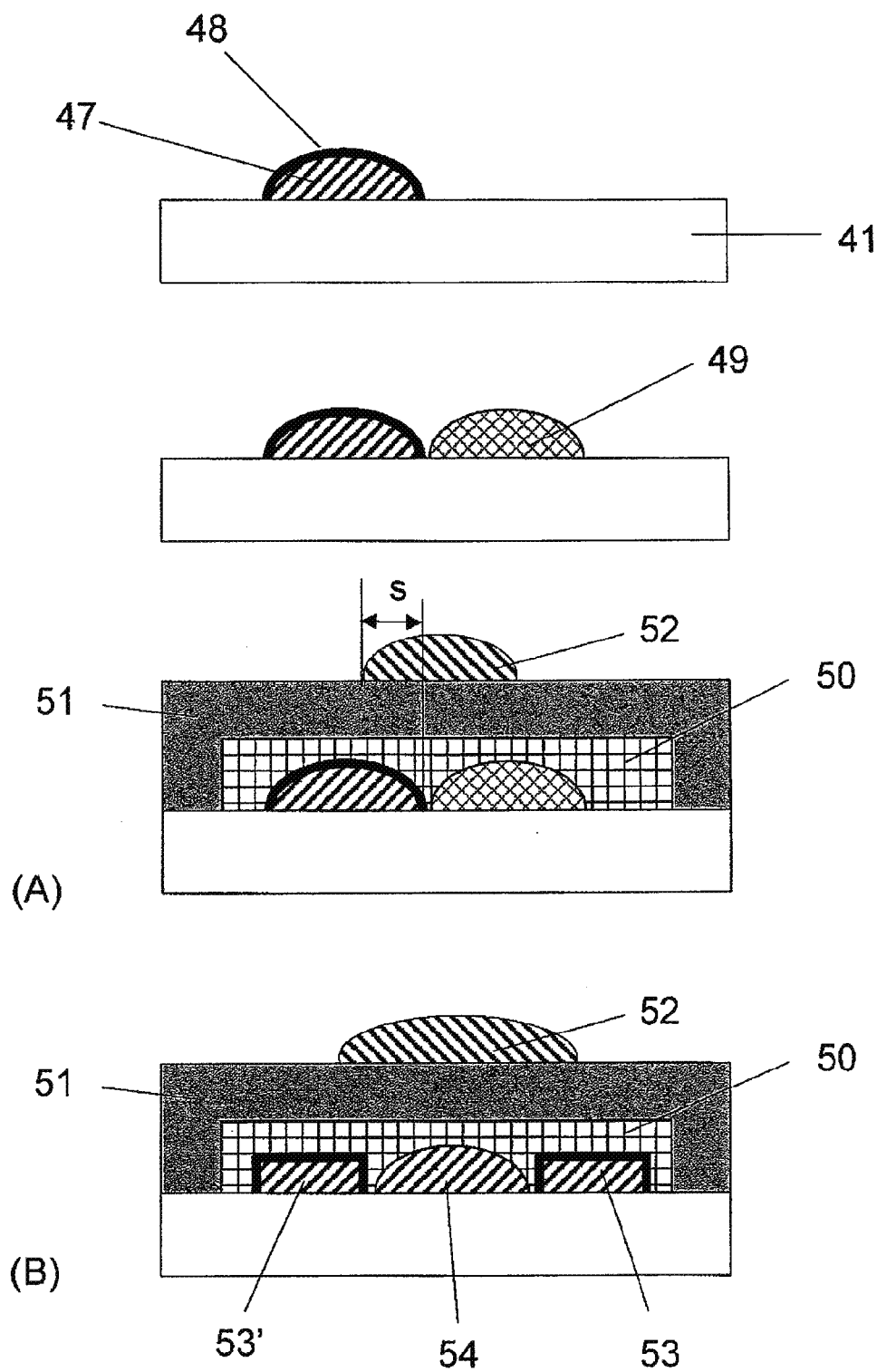
FIG. 8 illustrates the manufacturing process for a printed top-gate TFT with a source-drain electrode fabricated by the SAP technique.

A method according to an embodiment of the present invention is applicable to electronic device other than TFTs. It can be applied to any electronic device which requires alignment of an upper electrode with respect to a previously deposited optically opaque structure on the substrate. An example includes a diode device, such as for example a light-emitting diode, in which the parasitic capacitance between the anode and cathode interconnects needs to be minimized. A possible device structure is shown in FIG. 7. On a substrate 29 an optically opaque electrode structure 30 is defined. In the active area of the device an optically transparent metal such as indium tin oxide is defined, which might act for example as anode for an organic light-emitting diode or photosensing diode. Then an active semiconducting layer 31 such as a light-emitting polymer is deposited. This is followed by deposition of a photosensitive dielectric layer 32, which is patterned by backside light exposure as described above. Upon deposition of a top-gate electrode patterned by any of the techniques described above, such as SLAP, a self-aligned cathode for a light-emitting diode can be defined with a low parasitic overlap capacitance with the anode interconnect 30.

The present invention is not limited to gate patterning by SLAP. Any other subtractive patterning technique for the gate electrode can be used, such as photolithographic patterning. In the case of photolithography the gate electrode pattern is defined by depositing an additional photoresist pattern on top of the continuous gate metallization 19. The photoresist is patterned by exposure through a photomask, such that above the channel a photoresist protection layer is defined with a gate linewidth that is generally larger than the width of the trench generated above the first dielectric layer. By subsequent etching the gate pattern is defined, and a similar structure as shown in FIG. 4B results with the regions of the gate line that extend beyond the trench being located on thick regions of the thick photosensitive dielectric layer and minimum impact on the overlap capacitance.

Alternatively, a lift-off process can be used. In this case prior to the deposition of the gate metal 19 an additional photoresist layer is deposited and patterned on top of the patterned photosensitive dielectric layer. Again the gate linewidth defined in the additional photoresist is selected larger than the width of the trench generated above the first dielectric layer to ensure adequate coverage of the channel even in the presence of substrate distortion. After deposition of the gate metal a lift of process is then used to pattern the gate metal resulting in a similar structure as shown in FIG. 4B.

The gate dielectric layer might be any layer that provides charge confinement at the interface between the active semiconducting and the dielectric layer. As such the gate dielectric layer might itself be a semiconducting layer with a higher ionisation potential and/or lower electron affinity than that of the active semiconducting layer.

Having considered a subtractive technique for the top gate formation, methods and examples are now provided for a second additive technique for forming the top gate.

Figure 9:
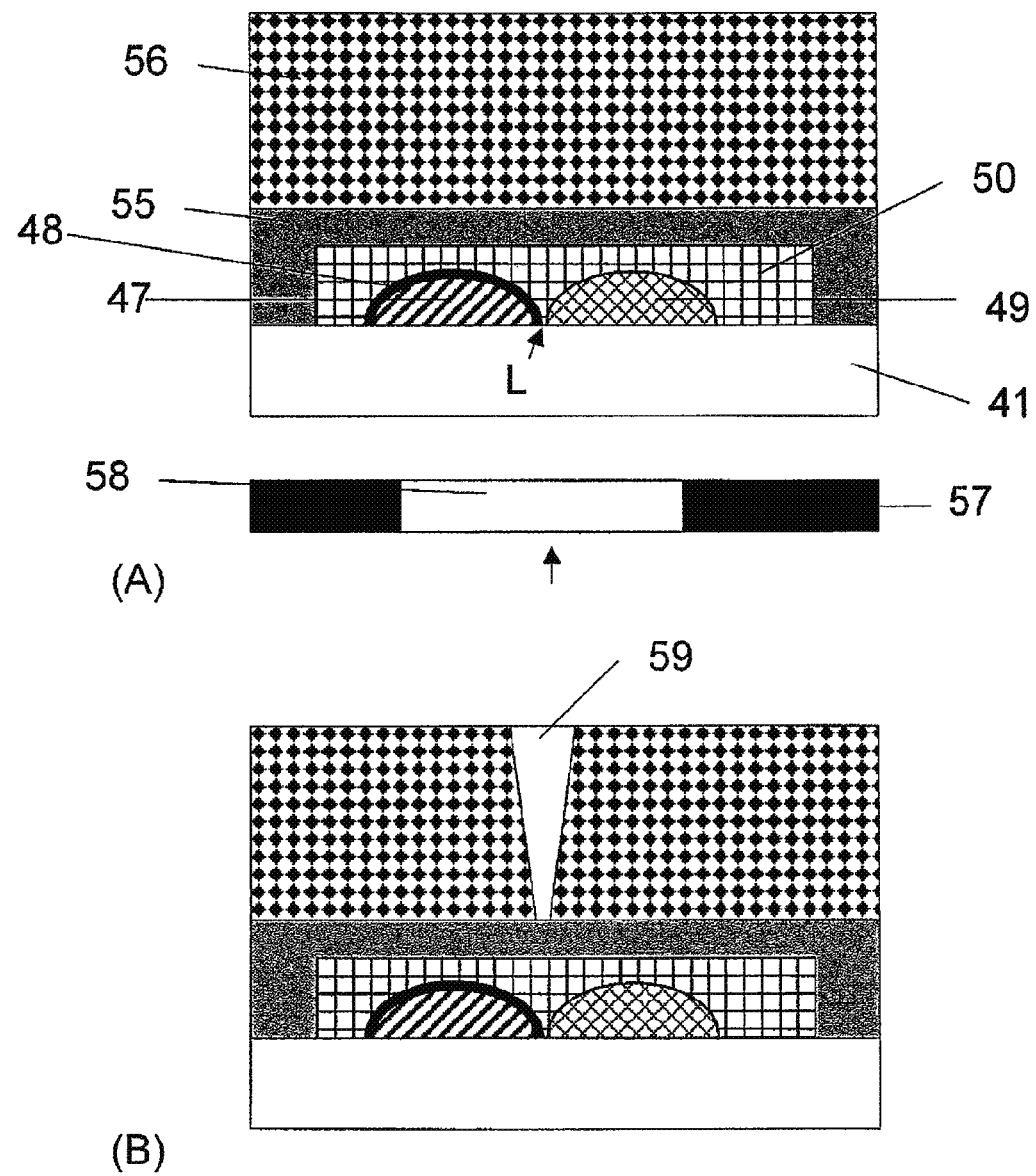
FIG. 9 illustrates the initial manufacturing process steps for a printed top-gate TFT with a source-drain electrode fabricated by the SAP technique and a self-aligned gate according to an embodiment of the present invention.

In this instance, the method we describe is based on the use of a multilayer gate dielectric on top of a source-drain electrode structure with channel length L. The patterning of the source-drain structure can be performed by any technique such as but not limited to photolithography, shadow mask evaporation, printing, laser ablation, laser transfer patterning, embossing, stamping, soft lithography. After patterning/deposition of the source-drain electrodes 47, 49 and semiconducting active layer 50 a first dielectric material 55 is deposited in contact with the semiconducting material of the device (FIG. 9). The first dielectric is chosen for optimum performance of the transistor, i.e. its thickness is sufficiently thin that the required transconductance of the device is reached, while ensuring that the leakage current through the dielectric is sufficiently small. A material is selected which forms a suitable interface structure with the semiconducting material, such that the device exhibits a high field-effect mobility. The first dielectric might also comprise a multilayer of dielectric layers comprising, for example a sequence of low k and high k dielectrics.

On top of the first dielectric layer a second dielectric 56 is deposited. This dielectric is a photosensitive material which can be patterned by exposure to light of a suitable wavelength. After deposition of the second dielectric material the substrate is exposed to light through the back of the substrate in order to define a pattern of the second dielectric materials with edges aligned to the edges of the source-drain electrodes. The source-drain electrodes are selected to be sufficiently thick and optically opaque that during the backside light exposure the photosensitive dielectric material is only exposed to light in the region of the channel, and away from the electrodes but not on top of the electrodes. The light exposure is preferably performed through a suitably designed and coarsely aligned shadow mask with light transmissive and light blocking regions 58 and 57, respectively, to shield certain regions of the photosensitive layer away from the electrodes of the transistors that would otherwise be exposed to the light. In this a self-aligned pattern in the second dielectric layer is created with a trench region 59 over the channel of the device in which the second dielectric layer is removed or at least thinned significantly. After patterning of the second dielectric layer the gate metallization is deposited and coarse patterned by a suitable patterning technique. For the low-cost patterning processes being considered here the linewidth of the gate electrode pattern 64 is larger than that of L, and the edges of the gate electrode metallization pattern can not easily be aligned with respect to the channel. However, since the gate dielectric is much thicker over the electrode regions than over the active channel due to the self-aligned patterning of the second layer of gate dielectric this does not result in a significant parasitic capacitance. In fact, the parasitic capacitance can be minimized of the device by making the thickness of the second dielectric layer sufficiently large without affecting adversely the transconductance, since the transconductance is primarily affected by the thickness of the first dielectric layer.

Embodiments of a method according to the present invention are able to form a self-aligned gate electrode with associated low parasitic capacitance for gate patterning techniques that are not able to define gate linewidths comparable to the channel length L.

The gate patterning can be performed by any patterning technique including but not limited to, photolithographic patterning, shadow mask evaporation, printing, laser ablation, laser transfer patterning, embossing, stamping, soft lithography, etc.

According to one preferred embodiment of the invention the gate patterning is performed by a printing technique, such as but not limited to inkjet printing, offset printing, gravure printing, flexographic printing or screen printing. In this case the gate electrode conducting material is deposited onto the substrate from liquid phase and dried on the substrate.

According to a particularly preferred embodiment of the invention the source-drain electrode structure is fabricated with a submicrometer channel length by self-aligned printing.

The different embodiments of the invention will now be described in detail in the following examples.

Example 4

Self-Aligned Gate Patterning by Printing

On a substrate 11 a pattern of source-drain electrodes as well as interconnect lines is defined. The substrate can be a rigid substrate such as, but not limited to, a glass or silicon substrate or a flexible substrate such as a plastic substrate or a flexible metal foil. The substrate may comprise suitable planarisation, passivation or encapsulation layers. The substrate and any of the layers on top need to be selected in order to be transparent at the wavelength of light to which the photosensitive dielectric layer is to be exposed. For standard UV light exposure plastic substrates such as PET substrates and glass substrates exhibit sufficient transparency. The source-drain electrodes comprise a conducting material, such as inorganic metals, for example, gold, aluminium, palladium, nickel, or an organic conducting polymer such as polyethylenedioxythiophene doped with polystyrene sulfonate (PE-DOT/PSS). The conducting material can be deposited either from vacuum phase or from solution. Patterning of the conducting materials can be either subtractively, for example, by photolithographic patterning or additively by direct printing techniques, such as, but not limited to inkjet, gravure, offset or screen printing. The thickness of the source-drain electrodes is selected such that the electrodes are sufficiently opaque at the wavelength of light that is used for the subsequent backside light exposure of the photosensitive material. In the case of an inorganic metal, such as gold a typical film thickness of 20-100 nm is suitable.

According to a preferred embodiment of the present invention the source-drain electrodes are defined by direct printing of the conducting material. The conducting material is preferably a printable dispersion of colloidal metal nanoparticles that can be converted into a high conductivity metals structure on the substrate by techniques such as thermal or laser annealing. To consistently define the linewidth and channel length of the printed electrodes techniques such as surface energy assisted printing as described in US20050274986 can be used.

Once the conductive layer has been patterned to form the source and drain electrodes, a layer of semiconducting material 50 is then deposited over the substrate and patterned electrodes. The semiconducting layer may comprise an organic semiconductor, such as, but not limited to, polyarylamine, polyfluorene or polythiophene-based semiconducting polymers or small molecule semiconductors such as pentacene or rubrene. Alternatively, inorganic semiconductors, such as vacuum deposited amorphous or polycrystalline silicon, or solution-deposited inorganic nanomaterials, such as colloidal nanoparticles or nanowires can be used.

In the case of solution processed semiconductors a broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, blade coating or dip coating, curtain coating, meniscus coating, spray coating, or extrusion coating. Alternatively, the semiconducting layer may be deposited as a thin continuous film and patterned subtractively by techniques such as photolithography (see WO 99/10939) or laser ablation.

A first layer of gate dielectric material 55 is then deposited onto the layered substrate. The first gate dielectric layer is selected such that the device exhibits optimum device performance in terms of field-effect mobility, gate leakage current and transistor OFF current, threshold voltage and subthreshold slope as well as environmental and operational stability. The selection of the first dielectric is according to criteria known in the prior art (see for example, H. Sirringhaus, Adv. Mat. 17, 1 (2005)). A suitable choice of dielectric in combination with a polymer semiconductor such as poly-dioctylfluorene-co-bithiophene (F8T2), poly-3-hexylthiophene (P3HT) or polytriarylamine (PTAA) is polyisobutylene or polyvinylphenol, but preferably polymethylmethacrylate (PMMA) and polystyrene (PS) are used. Alternatively, the first dielectric layer may be a self-assembled monolayer deposited on the surface of the underlying layer (Klauk, Nature 431, 963 (2004); Yoon, Proceedings of the National Academy of Sciences 102, 4678 (2005)). A general review of possible dielectric layers compatible with organic semiconductors is given in Facchetti, Adv. Mat. 17, 1705 (2005)). Preferably, the first dielectric material is deposited from solution, and care is taken that the solvent for the deposition of the first dielectric is selected such as to avoid swelling and dissolution of the semiconducting layer underneath (US2005274986). The dielectric material may be deposited in the form of a continuous layer, by techniques such as, but not limited to, spin-, spray or blade coating, or direct printing such as inkjet, gravure, offset or screen printing. Alternatively, more than one dielectric layer may be deposited to form a dielectric stack, for example a combination of a low-k interfacial dielectric to achieve a high field-effect mobility, and a higher-k dielectric to achieve a sufficient dielectric capacitance for a given thickness.

The thickness of the first gate dielectric layer is chosen sufficiently thin in order for the device to meet basic device scaling requirement. The thickness of the first gate dielectric layer is preferably chosen to be less than the channel length L of the transistor. More preferably the thickness of the gate dielectric is chosen to be less than half the channel length. Most preferably, the dielectric thickness is chosen to be less than one fourth of the channel length. In this way short channel effects that deteriorate the current voltage characteristics, and lead for example to a lack of saturation of the output characteristics of the transistor and reduced circuit gain, can be minimized.

Preferably the first dielectric layer has a thickness of between 10 to 500 nm. Preferably, the first dielectric is a solution-deposited polymer dielectric. According to a preferred embodiment of the present invention the first dielectric layer is a crosslinked polymer dielectric layer, as described, for example, in Facchetti et al., Adv. Mat. 17, 1705 (2005). Crosslinked polymer dielectrics enable very thin pinhole-free films with thicknesses below 50 nm that are difficult to achieve without forming a cross-linked network of chains, and are robust against dissolution during any of the subsequent solution deposition and development steps. Alternatively, the first gate dielectric might be a self-assembled monolayer dielectric (Halik, Nature 431, 963 (2004)).

Subsequently, a second photosensitive dielectric material 56 is deposited as a continuous film over the first gate dielectric layer. The second photosensitive dielectric material is preferably a positive photoresist, which can be removed selectively from the substrate in regions where the material has been exposed to light using a suitable developing process. The photosensitive dielectric material is preferably deposited from solution by a large area coating technique such as spin coating, spray or blade coating. For example, a layer of standard SHIPLEY® 1813 positive UV photoresist can be used. Alternatively, other positive photoresists know in the prior art might also be used. An overview over possible positive photoresist materials is given in H. Ito, IBM J. Res. & Dev. 45, 683 (2001). Other photosensitive dielectrics that change their solubility characteristics upon light exposure, such that they can be removed selectively in exposed regions of the substrate might also be used.

Subsequently, the substrate is exposed to light through the backside of the substrate (FIG. 10A) such that the predeposited source-drain electrode structure acts as a self-aligned photomask. In this way the photosensitive dielectric material 56 is exposed to light only in the channel region, but is protected from light exposure on top of the source-drain electrodes. Preferably, light of UV wavelength is used for the exposure in combination with conventional UV photoresists. Alternatively, visible or infrared light might be used in combination with photoresists which are sensitive in this spectral range. The exposed photosensitive material is then developed in a suitable developer solution which removes the material in the exposed regions of the substrate. The solvent composition of the developing solution is selected such that the underlying second gate dielectric layer is not dissolved or removed in this step. In the case of SHIPLEY® 1813 photoresist, and a first gate dielectric layer of PMMA MF319 developing solution can be used. In this way a pattern of trenches is defined in the second dielectric layer the position of which is self-aligned to that of the underlying channel region, and at the bottom of which the underlying first gate dielectric layer is exposed. The opening area of trenches can be controlled by a selection of developing time which should be selected as short as to get small overlap between gate to source and drain.

The topographic profile of the trench structure is determined by the properties of the resist material employed, the profile of the source-drain electrodes and by the optical properties of the layer structure. Light scattering by the source-drain electrodes, or within any of the layers tends to broaden the width of the trench. If the thickness of the source-drain electrodes diminishes towards the edge of the channel as is often the case in printed electrodes deposited from solution, there might be a region near the edge of the channel where the electrodes are not fully opaque, and light can be transmitted through the thin edge of the electrode. The degree to which this happens can be controlled by controlling the edge profile of the source-drain electrodes (see further discussion below).

Figure 10:
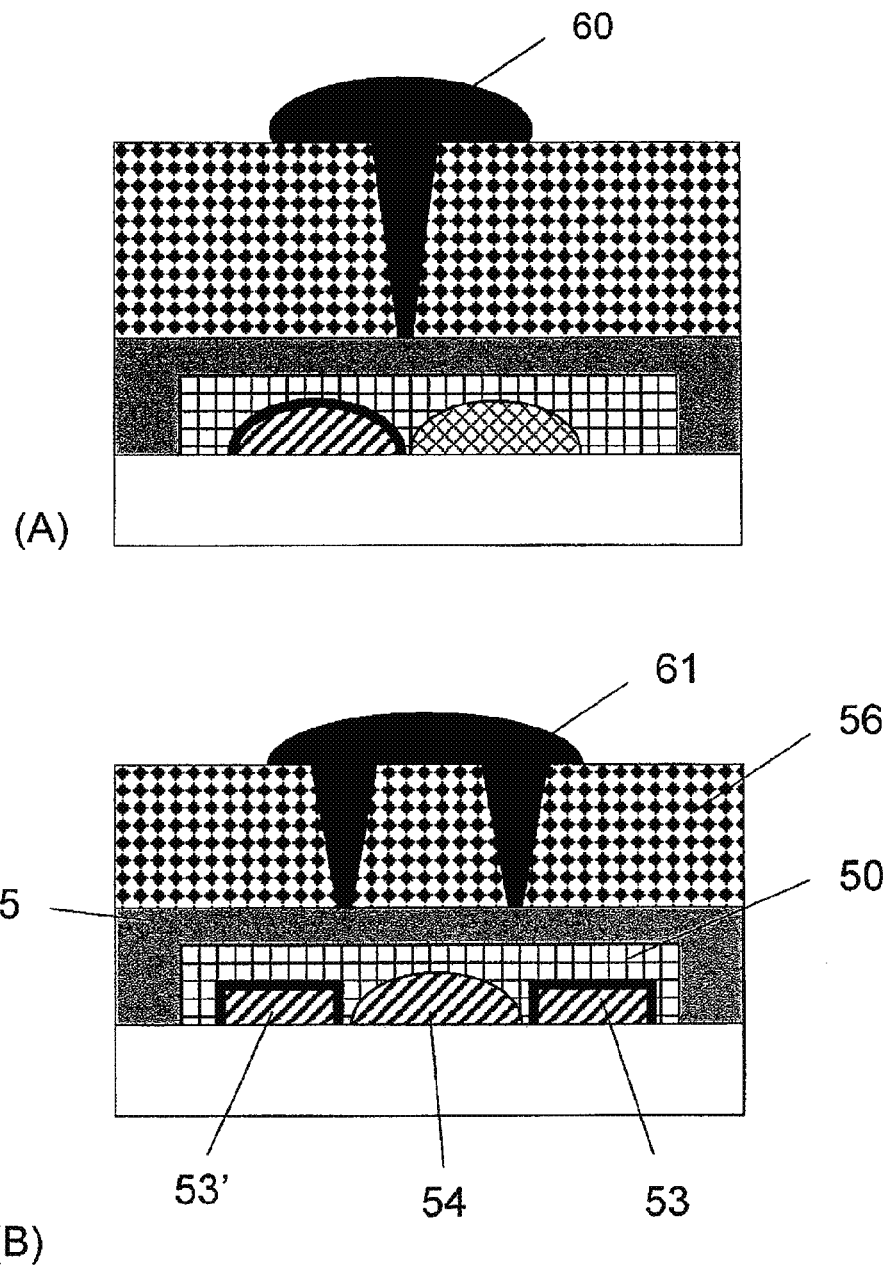
FIG. 10 illustrates the final gate patterning step for a printed top-gate TFT with a source-drain electrode fabricated by the SAP technique and a self-aligned gate according to an embodiment of the present invention.

Finally, the gate electrode 60 is deposited on top. The gate electrode pattern is defined to fill the trench structure in the second photosensitive dielectric material (FIG. 10A). Preferably, the gate electrode is deposited by printing of a conducting material, such as inkjet printing of nanoparticle metal or conducting polymer solution/dispersion. Other printing techniques, such as, but not limited to offset printing, screen printing, gravure and flexographic printing might also be used. Solution-deposition, printing, and surface wetting conditions are selected in order to ensure good filling of the trench. To improve surface wetting the surface of the substrate might be exposed to a surface conditioning such as an oxygen plasma treatment prior to the deposition of the gate electrode.

Most printing techniques are not capable to define patterns with linewidths of several microns or even submicrometer dimensions. Therefore, the linewidth of the gate line pattern will in general be wider than the width of the trench, and the gate line will extend into the regions around the trench which are covered by the second photosensitive dielectric layer (FIG. 10A).

The thickness of the second photosensitive dielectric material is selected to minimize the contribution to the source-drain to gate overlap capacitance from the regions in which the gate line extends beyond the trench defined in the second dielectric material. The overlap capacitance is determined by a first contribution from the thin region of the first gate dielectric material on top of the channel/at the bottom of the trench and second contribution from the adjacent regions in which the gate electrode is located on top of the second dielectric layer. The thicker the second dielectric layer can be made the lower is the second contribution to the parasitic overlap capacitance. On the other hand, the thickness of the second dielectric layer is limited by mechanical adhesion as well as the need to achieve a high yield for trench filling. Preferably the thickness of the second dielectric material is on the order of 500 nm-10 μm.

A method according to an embodiment of the present invention is capable of defining a short-channel transistor with a self-aligned gate electrode and low overlap capacitance wherein the gate electrode is defined by a printing technique with a linewidth which is significantly wider than the channel length.

If further reduction of overlap capacitance is required the portions of the printed gate electrode which extend beyond the trench in the photosensitive dielectric layer can also be removed from the substrate in a subsequent lift-off developing step in a solvent for the photosensitive dielectric layer. During the developing step the photosensitive dielectric layer is dissolved in the solvent and lifts off the portions of the printed gate electrode that are located on top of the photosensitive gate electrode together with it. The final structure comprises then only the portions of the gate electrode inside the trench on top of the first dielectric layer. In this structure the contribution to the overlap capacitance from the portions of the gate electrode on top of the photosensitive dielectric is eliminated.

For the present self-aligned gate device structure a low contact resistance for charge injection from the source and drain electrodes into the semiconducting layer is required. For semiconductor/metal combinations for which a significant contact resistance is present current crowding effects usually occur in device architectures where the gate electrode overlaps with the source-drain electrodes and the accumulation layer extends from the channel into the region above the contacts (Chiang, Jap. J. Appl. Phys. 37, 5914 (1998)). In such structures some of the current can be injected away from the edge of the source-drain metal electrodes leading to an effective lengthening of the channel and lowering of the contact resistance compared to the situation where most of the current needs to be injected right at the edge of the contacts. In the self-aligned gate architecture disclosed here current crowding effects are limited by the low density of accumulated charge in the thick dielectric regions adjacent to the trench structure, and therefore it is more important to select the source-drain contacts to exhibit a low contact resistance. In the case of organic semiconductors contact resistance effects can be reduced by choosing a metal electrode with a work function that is closely matched to the ionisation potential and electron affinity, respectively, of the semiconductor or by suitable physical or chemical contact modification.

The degree of geometrical overlap between the trench and the source and drain electrodes can be controlled with the thickness profile of the first electrode structure. If the first electrode remains opaque right to the edge of the channel the overlap is minimal. Larger overlap can be realized by producing a first electrode structure which thins towards the edge of the channel and becomes effectively semi-transparent at some distance from the edge of the channel. The latter structure might be desirable for semiconducting materials in which the contact resistance needs to be reduced with the help of current crowding effects (see discussion below).

Example 5

Self-Aligned Gate Patterning by for Source-Drain Electrode Structures Fabricated by Self-Aligned Printing According to a particularly preferred embodiment of the invention the source-drain electrodes are defined by the method of self-aligned printing US20050151820. In this method (FIG. 9) one of the two electrodes 47 is defined first in a first metal deposition and patterning step, which might be achieved by either deposition of a continuous metal film followed by photolithographic patterning, or by direct write printing, such as inkjet printing. Materials such as, but not limited to, gold, silver, copper, aluminium or conducting polymers such as PEDOT/PSS can be used. Subsequently, the surface of the first electrode is prepared to become repulsive to the liquid ink to be used for deposition of the second electrode. The step of surface preparation may comprise selective deposition of a lipophobic self-assembled monolayer onto the surface of the first electrode, exposure to a plasma treatment or the mixture of a surface segregating species (such as a surfactant) into the ink from which the first electrode is defined. In the case of a first electrode of gold deposited either by printing from a nanoparticle dispersion or by vacuum evaporation a thiol-based fluorinated self-assembled monolayer 8 can be used to render the surface of the first electrode dewetting.

Then the second electrode 49 is defined by liquid deposition of a conductive ink, such that the liquid ink comes at least partially in contact with the first electrode. A preferred method of deposition is inkjet printing. Due to the repulsive surface coating on the surface of the first electrode the liquid ink flows off the surface of the first electrode and dries with its contact line edge in close proximity, but not in electrical contact with the first electrode. In this way a very small gap with dimensions typically less than 1 µm is formed between the first and second electrodes which defines the channel length L of the transistor (FIG. 9A).

The first electrode can also be defined in two separate portions 53 and 53' (see FIG. 10B) with a well defined separation in between the two electrodes. The first electrode can be defined, for example, by deposition of a metal film of gold or other inorganic metal followed by photolithography or other subtractive patterning. Alternatively, the first electrode might be defined by direct printing of a nanoparticle or precursor metal solution or of a conducting polymer. In this configuration the second electrode 54 is confined on both sides by the first electrode, i.e., the liquid link is "squeezed" into the gap between the two portions of the first electrode. In this way we have found that the size of the gap formed between the first and second electrodes is less sensitive to variations of the position at which the liquid ink droplets are deposited with respect to the first electrode, and more consistent gap formation can be achieved. In this case the channel is formed on two opposite edges of the second electrode giving rise to an approximate doubling of the channel width per unit length of the second electrode line.

Other techniques for defining the source-drain electrodes using the self-aligned printing technique can be used as well as disclosed in US20050151820—the entire content of which is included in the present document by way of reference.

Once the conductive layer has been patterned to form the source and drain electrodes, a layer of semiconducting material 50 is then deposited over the substrate and patterned electrodes. The semiconducting layer may comprise an organic semiconductor, such as, but not limited to, polyarylamine, polyfluorene or polythiophene-based semiconducting polymers or small molecule semiconductors such as pentacene or rubrene. Alternatively, inorganic semiconductors, such as vacuum deposited amorphous or polycrystalline silicon, or solution-deposited inorganic nanomaterials, such as colloidal nanoparticles or nanowires can be used.

In the case of solution processed semiconductors a broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, blade coating or dip coating, curtain coating, meniscus coating, spray coating, or extrusion coating. Alternatively, the semiconducting layer may be deposited as a thin continuous film and patterned subtractively by techniques such as photolithography (see WO 99/10939) or laser ablation.

A first layer of gate dielectric material 55 is then deposited onto the layered substrate. The first gate dielectric layer is selected such that the device exhibits optimum device performance in teems of field-effect mobility, gate leakage current and transistor OFF current, threshold voltage and subthreshold slope as well as environmental and operational stability. The selection of the first dielectric is according to criteria known in the prior art (see for example, H. Sirringhaus, Adv. Mat. 17, 1 (2005)). A suitable choice of dielectric in combination with a polymer semiconductor such as poly-dioctylfluorene-co-bithiophene (F8T2), poly-3-hexylthiophene (P3HT) or polytriarylamine (PTAA) is polyisobutylene or polyvinylphenol, but preferably polymethylmethacrylate (PMMA) and polystyrene (PS) are used. Preferably, the first dielectric material is deposited from solution, and care is taken that the solvent for the deposition of the first dielectric is selected such as to avoid swelling and dissolution of the semiconducting layer underneath (US2005274986). The dielectric material may be deposited in the form of a continuous layer, by techniques such as, but not limited to, spin-, spray or blade coating, or direct printing such as inkjet, gravure, offset or screen printing. Alternatively, more than one dielectric layer may be deposited to form a dielectric stack, for example a combination of a low-k interfacial dielectric to achieve a high field-effect mobility, and a higher-k dielectric to achieve a sufficient dielectric capacitance for a given thickness.

The thickness of the first gate dielectric layer is chosen sufficiently thin in order for the device to meet basic device scaling requirement. The thickness of the first gate dielectric layer is preferably chosen to be less than the channel length L of the transistor. More preferably the thickness of the gate dielectric is chosen to be less than half the channel length. Most preferably, the dielectric thickness is chosen to be less than one fourth of the channel length. In this way short channel effects that deteriorate the current voltage characteristics, and lead for example to a lack of saturation of the output characteristics of the transistor and reduced circuit gain, can be minimized.

Preferably the first dielectric layer has a thickness of between 10 to 500 nm. Preferably, the first dielectric is a solution-deposited polymer dielectric. According to a preferred embodiment of the present invention the first dielectric layer is a crosslinked polymer dielectric layer, as described, for example, in Facchetti et al., Adv. Mat. 17, 1705 (2005). Crosslinked polymer dielectrics enable very thin pinhole-free films with thicknesses below 50 nm that are difficult to achieve without forming a cross-linked network of chains, and are robust against dissolution during any of the subsequent solution deposition and development steps. Alternatively, the first gate dielectric might be a self-assembled monolayer dielectric (Halik, Nature 431, 963 (2004)).

Subsequently, a second photosensitive dielectric material 56 is deposited as a continuous film over the first gate dielectric layer. The second photosensitive dielectric material is preferably a positive photoresist, which can be removed selectively from the substrate in regions where the material has been exposed to light using a suitable developing process. The photosensitive dielectric material is preferably deposited from solution by a large area coating technique such as spin coating, spray or blade coating. For example, a layer of standard SHIPLEY® 1813 positive UV photoresist can be used. Alternatively, other positive photoresists know in the prior art might also be used. An overview over possible positive photoresist materials is given in H. Ito, IBM J. Res. & Dev. 45, 683 (2001). Other photosensitive dielectrics that change their solubility characteristics upon light exposure, such that they can be removed selectively in exposed regions of the substrate might also be used.

Subsequently, the substrate is exposed to light through the backside of the substrate (FIG. 10A) such that the predeposited source-drain electrode structure acts as a self-aligned photomask. In this way the photosensitive dielectric material 56 is exposed to light only in the channel region, but is protected from light exposure on top of the source-drain electrodes. Preferably, light of UV wavelength is used for the exposure in combination with conventional UV photoresists. Alternatively, visible or infrared light might be used in combination with photoresists which are sensitive in this spectral range. The exposed photosensitive material is then developed in a suitable developer solution which removes the material in the exposed regions of the substrate. The solvent composition of the developing solution is selected such that the underlying second gate dielectric layer is not dissolved or removed in this step. In the case of SHIPLEY® 1813 photoresist, and a first gate dielectric layer of PMMA MF319 developing solution can be used. In this way a pattern of trenches is defined in the second dielectric layer the position of which is self-aligned to that of the underlying channel region, and at the bottom of which the underlying first gate dielectric layer is exposed.

Finally, the gate electrode 60 is deposited on top. The gate electrode pattern is defined to fill the trench structure in the second photosensitive dielectric material (FIG. 10A). Preferably, the gate electrode is deposited by printing of a conducting material, such as inkjet printing of nanoparticle metal or conducting polymer solution/dispersion. Other printing techniques, such as, but not limited to offset printing, screen printing, gravure and flexographic printing might also be used. Solution-deposition, printing, and surface wetting conditions are selected in order to ensure good filling of the trench. To improve surface wetting the surface of the substrate might be exposed to a surface conditioning such as an oxygen plasma treatment prior to the deposition of the gate electrode.

Most printing techniques are not capable to define patterns with linewidths of several microns or even submicrometer dimensions. Therefore, the linewidth of the gate line pattern will in general be wider than the width of the trench, and the gate line will extend into the regions around the trench which are covered by the second photosensitive dielectric layer (FIG. 10A).

The thickness of the second photosensitive dielectric material is selected to minimize the contribution to the source-drain to gate overlap capacitance from the regions in which the gate line extends beyond the trench defined in the second dielectric material. The overlap capacitance is determined by a first contribution from the thin region of the first gate dielectric material on top of the channel/at the bottom of the trench and second contribution from the adjacent regions in which the gate electrode is located on top of the second dielectric layer. The thicker the second dielectric layer can be made the lower is the second contribution to the parasitic overlap capacitance. On the other hand the thickness of the second dielectric layer is limited by mechanical adhesion as well as the need to achieve a high yield for trench filling. Preferably the thickness of the second dielectric material is on the order of 500 nm-10 μm.

For the present self-aligned gate device structure a low contact resistance for charge injection from the source and drain electrodes into the semiconducting layer is required. For semiconductor/metal combinations for which a significant contact resistance is present current crowding effects usually occur in device architectures where the gate electrode overlaps with the source-drain electrodes and the accumulation layer extends from the channel into the region above the contacts (Chiang, Jap. J. Appl. Phys. 37, 5914 (1998)). In such structures some of the current can be injected away from the edge of the source-drain metal electrodes leading to an effective lengthening of the channel and lowering of the contact resistance compared to the situation where most of the current needs to be injected right at the edge of the contacts. In the self-aligned gate architecture disclosed here current crowding effects are limited by the low density of accumulated charge in the thick dielectric regions adjacent to the trench structure, and therefore it is more important to select the source-drain contacts to exhibit a low contact resistance. In the case of organic semiconductors contact resistance effects can be reduced by choosing a metal electrode with a work function that is closely matched to the ionisation potential and electron affinity, respectively, of the semiconductor or by suitable physical or chemical contact modification.

Figure 11:
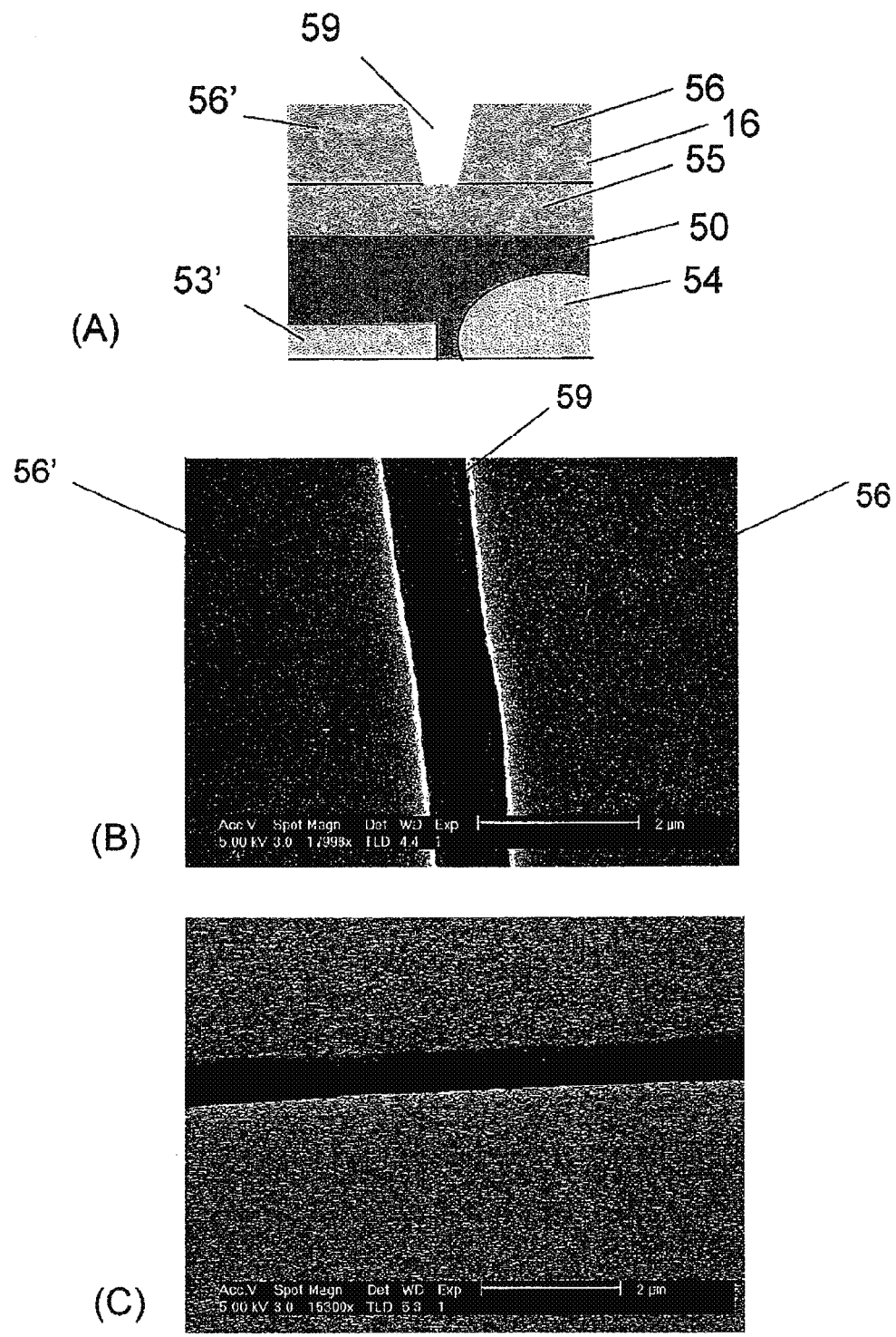
FIG. 11 shows scanning electron micrographs of the surface of the second, photosensitive dielectric after light exposure.
Figure 12:
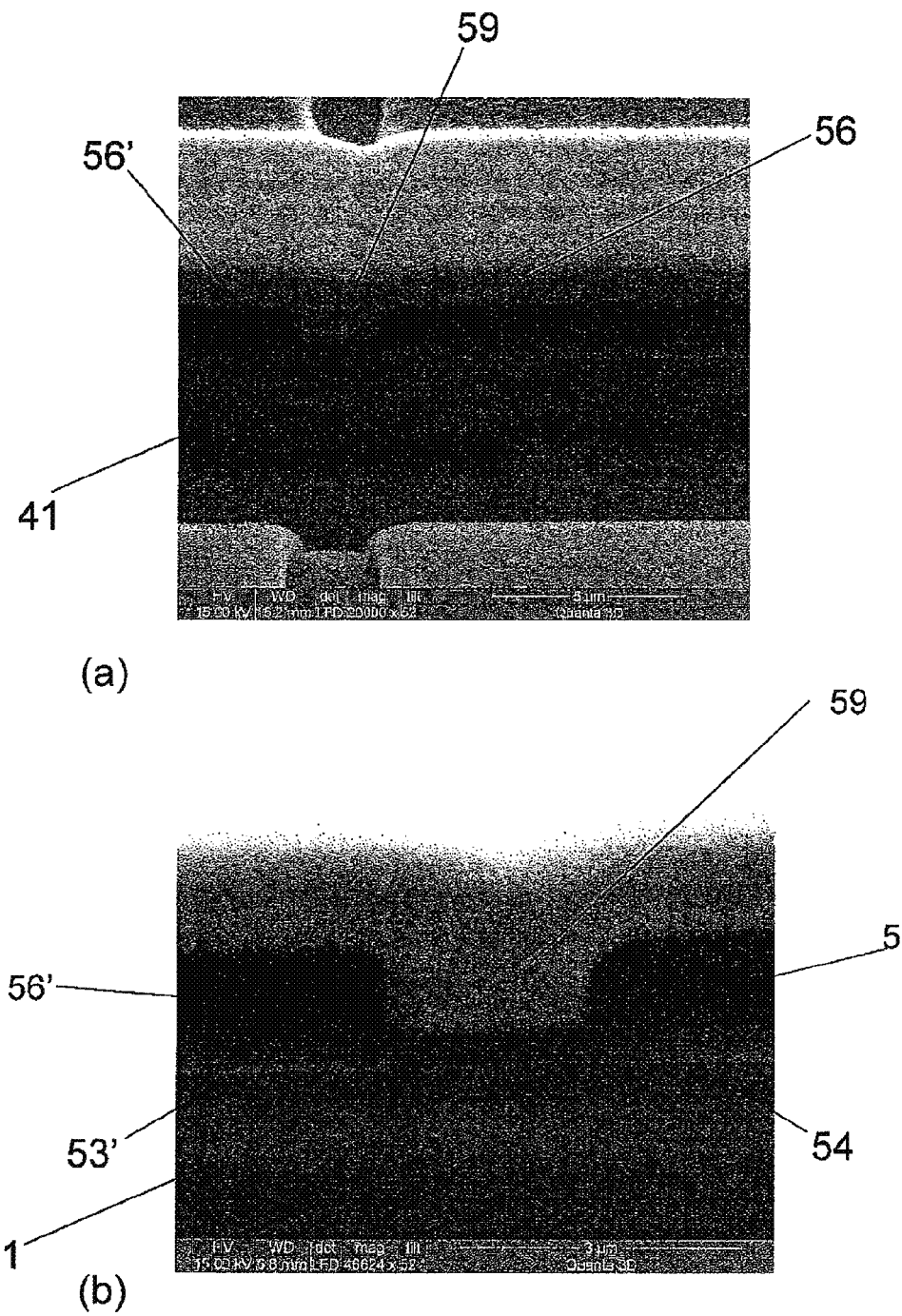
FIG. 12 shows focused ion beam (FIB) secondary electron images of cross-sectional view of the complete device with an opening of photosensitive dielectric for a self-aligned gate.

FIG. 11 shows a schematic diagram and scanning electron microscopy (SEM) images of the trench structure defined in the photosensitive dielectric layer (1813 resist) defined by light exposure through the back of a source-drain electrode structure defined by self-aligned printing (with one electrode defined by photolithography). It can clearly be seen that a narrow trench of width of about 1 µm is formed in a position self-aligned with the position of the underlying TFT channel. The width of the trench is significantly smaller than the linewidth of the gate electrode which can be achieved during the subsequent gate printing step (50-100 µm). The trench structure is confirmed by focused ion beam (FIB) secondary electron images of cross-sectional view of the complete device as shown in FIG. 12. This shows that the profile of the trench can be controlled by the profile of the underlying source-drain electrodes. The thicker the source-drain electrode near the edge the narrower the trench. Broader trenches can be achieved by using a thin edge of the source-drain electrodes.

The topographic profile of the trench structure is determined by the properties of the resist material employed, the profile of the source-drain electrodes and by the optical properties of the layer structure. Light scattering by the source-drain electrodes, or within any of the layers tends to broaden the width of the trench. If the thickness of the source-drain electrodes diminishes towards the edge of the channel as is often the case in printed electrodes deposited from solution, there might be a region near the edge of the channel where the electrodes are not fully opaque, and light can be transmitted through the thin edge of the electrode. The degree to which this happens can be controlled by controlling the edge profile of the source-drain electrodes. It can be seen in the profile shown in FIG. 11B and FIG. 12 that the side wall of the trench above the printed second electrode is somewhat less steep than that above the first electrode the edge of which was defined by photolithography (see FIG. 11A). In addition, the removed area of photoresistor on top of the printed second electrode after developing is larger than that on top of the first electrode and it means the edge of printed second electrode is not fully opaque to block light as a mask (see FIG. 12B). This creates a small and controlled overlap region which is helpful to minimize contact resistance effects by current crowding as discussed above.

Figure 13:
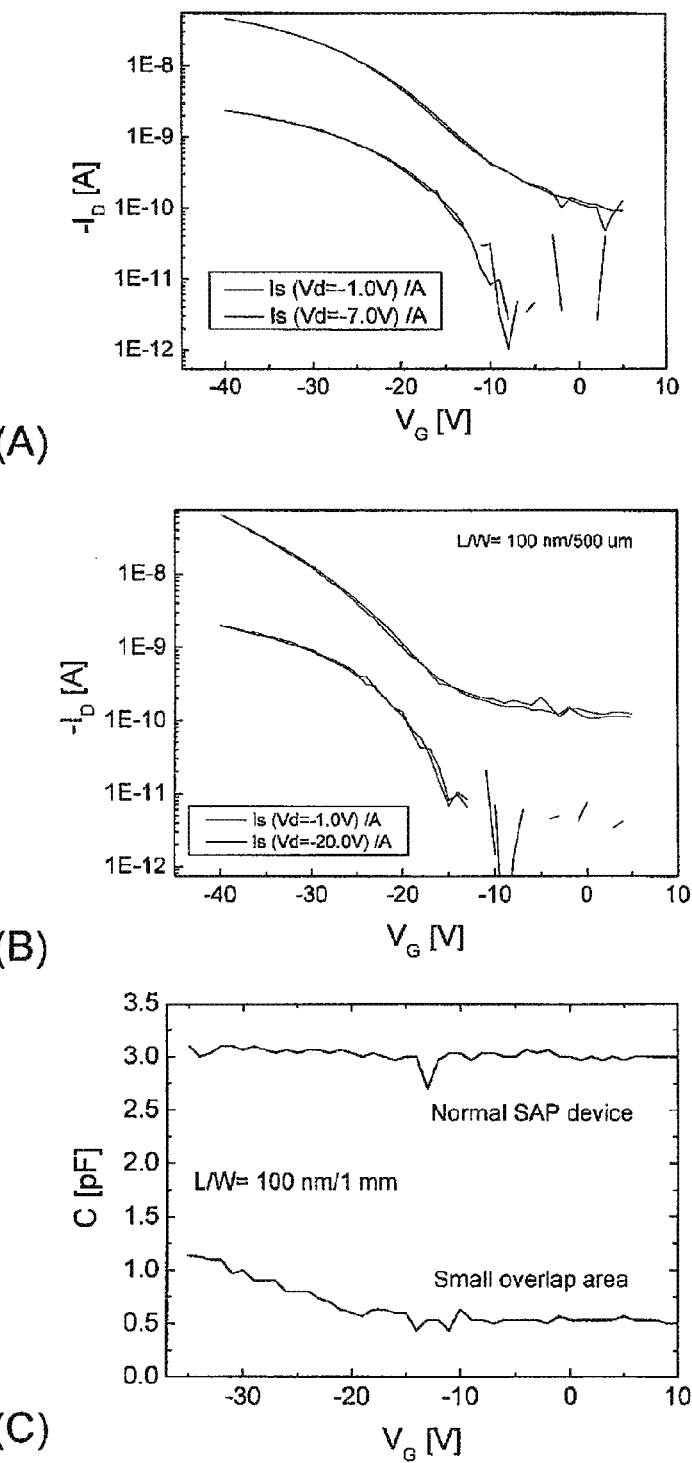
FIG. 13 shows TFT device characteristics of TFTs with self-aligned printed electrodes with (A) and without (B) a self-aligned gate electrode. The reduction of capacitance by using the self-aligned gate electrode is shown in B.

FIGS. 13 A and B show transfer characteristics of the TFT devices formed with the same gate dielectric with (A) and without (B) the self-aligned trench/gate electrode defined with the help of backside exposure of a photosensitive dielectric. It can be seen that the static DC characteristics of the two devices are very similar demonstrating that the performance of the organic TFT is not degraded by the UV light exposure and the processing/development of the photosensitive dielectric layer.

FIG. 13 C shows capacitive voltage measurements of devices with and without the self-aligned trench/gate electrode. It can clearly be seen that the device with the self-aligned gate exhibits a significantly reduced capacitance compared to the device without the self-aligned gate electrode. This demonstrates clearly the benefit achieved by methods according to embodiments of the present invention.

A method according to an embodiment of the present invention is capable of defining a short-channel transistor with submicrometer channel lengths as defined by the self-aligned printing technique with a self-aligned gate electrode and low overlap capacitance wherein the gate electrode is defined by a printing technique with a linewidth which is significantly wider than the channel length.

If further reduction of overlap capacitance is required the portions of the printed gate electrode which extend beyond the trench in the photosensitive dielectric layer can also be removed from the substrate in a subsequent lift-off developing step in a solvent for the photosensitive dielectric layer. During the developing step the photosensitive dielectric layer is dissolved in the solvent and lifts off the portions of the printed gate electrode that are located on top of the photosensitive gate electrode together with it. The final structure comprises then only the portions of the gate electrode inside the trench on top of the first dielectric layer. In this structure the contribution to the overlap capacitance from the portions of the gate electrode on top of the photosensitive dielectric is eliminated.

Example 6

Self-Aligned Gate Patterning with Low-Capacitance Interconnect Overlap Regions

Figure 14:
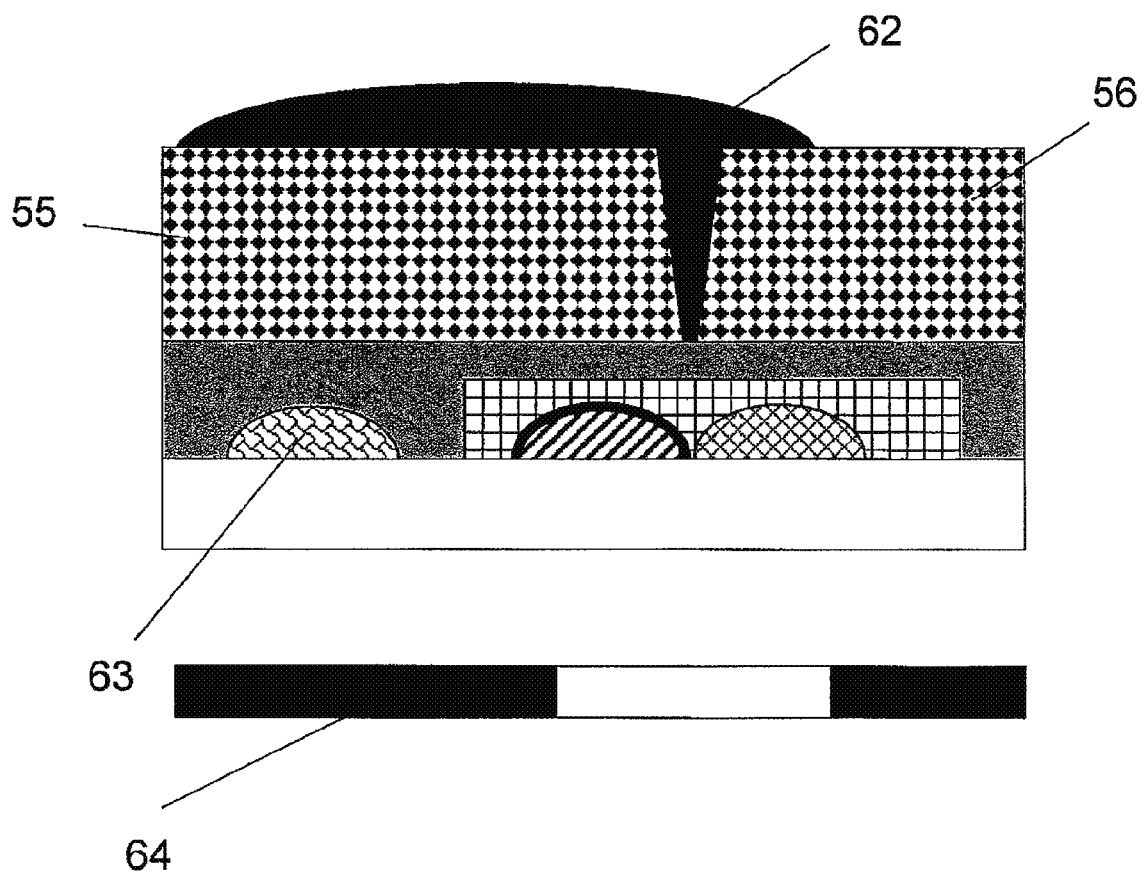
FIG. 14 illustrates a manufacturing process for a top-gate TFT with a self-aligned gate electrode and low capacitance interconnect overlap regions according to an embodiment of the present invention.

A method according to an embodiment of the present invention can also be used to minimize the parasitic capacitance due to overlap between interconnect lines located on the gate level and interconnects located on the level of the source-drain electrodes. This is shown in FIG. 14. On the level of the source-drain electrode a data or interconnect line 63 is defined. This data line may be used to apply a voltage or current signal to one or more of the TFTs of the circuit. On the gate level there are similar interconnect lines 62 which might interconnect several of the TFTs, or be used to apply a voltage signal to one or more of the TFT gates. In the region in which the two interconnect lines 62 and 63 overlap a parasitic capacitor is created, which can be a significant factor limiting the switching performance of the TFT circuit, particularly in the case of wide interconnect lines, as is usually the case with interconnect lines defined by printing. In a standard TFT configuration where the interconnects and gate electrodes to the TFT are located on the same level, the dielectric layer which defines the parasitic overlap capacitance of the interconnect lines is the same as the gate dielectric layer, and therefore the parasitic overlap capacitance is large.

According to a further embodiment of the present invention the mask pattern 64 of light exposure which defines the trenches in the photosensitive dielectric layer is selected such that the light is blocked in the region in which the interconnects 62 and 63 overlap. In this way a thick dielectric is present in the region of overlap. This ensures that the regions of overlap between the interconnections have a much thicker dielectric than the gate dielectric of the TFTs ensuring low parasitic capacitance and optimum circuit switching speed.

Example 7

Figure 16:
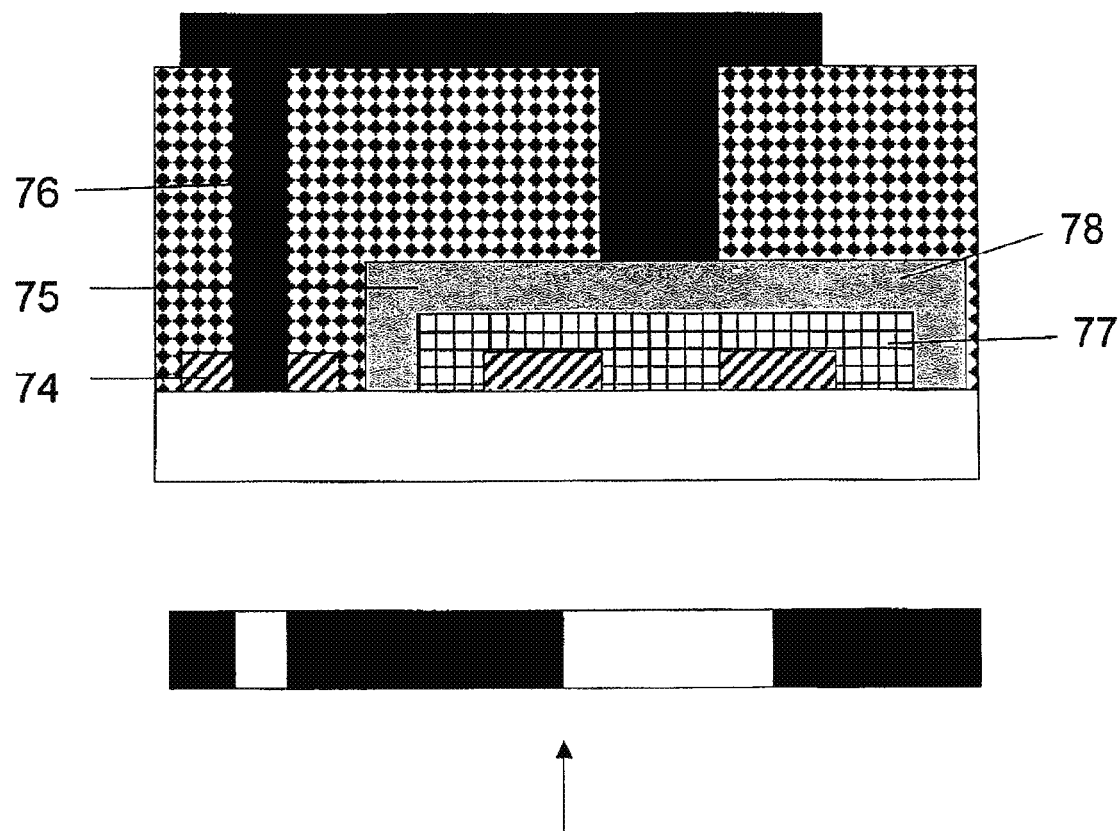
FIG. 16 illustrates a process for defining via-hole interconnections between the source-drain and gate levels at the same time as defining the self-aligned trenches over the transistor channel.

FIG. 16 illustrates a process which allows defining via-hole interconnections between source-drain and gate levels at the same time as defining the self-aligned trenches over the transistor channel. In this process conducting structures 74 that comprise a central opening are defined. The central opening is transparent to light and this allows defining a via-hole opening 75 in the thick photosensitive dielectric layer during the UV exposure and subsequent development step. In this embodiment of the invention it is preferred if the active semiconducting layer 77 and thin gate dielectric layer 75 are patterned and absent in the region of the via-hole structure. The via-hole is filled with conducting material at the same time as filling the trench over the transistor channel. In the central opening in the conducting structure 74 no conducting material may be present, in which case the via-hole connection is made around the edge of the conducting structure. Alternatively, the central opening might be filled with a transparent conductor such as a layer of conducting polymer, for example, PEDOT/PSS, that might be deposited inside the central opening by techniques such as inkjet printing, or other deposition/patterning technique prior to the deposition of the thick photosensitive dielectric layer. The method according to this embodiment provides a process simplification since it allows defining via-hole interconnections at the same time as the self-aligned gate trench structures.

The processes and devices described herein are not limited to devices fabricated with solution-processed polymers. Some of the conducting electrodes of the TFT and/or the interconnects in a circuit or display device (see below) may be formed from inorganic conductors, that are able to, for example, be deposited by the printing of a colloidal suspension or by electroplating onto a pre-patterned substrate. In devices where not all of the layers deposited from solution, one or more PEDOT/PSS portions of the device may be replaced with an insoluble conductive material such as a vacuum-deposited conductor.

Figure 15:
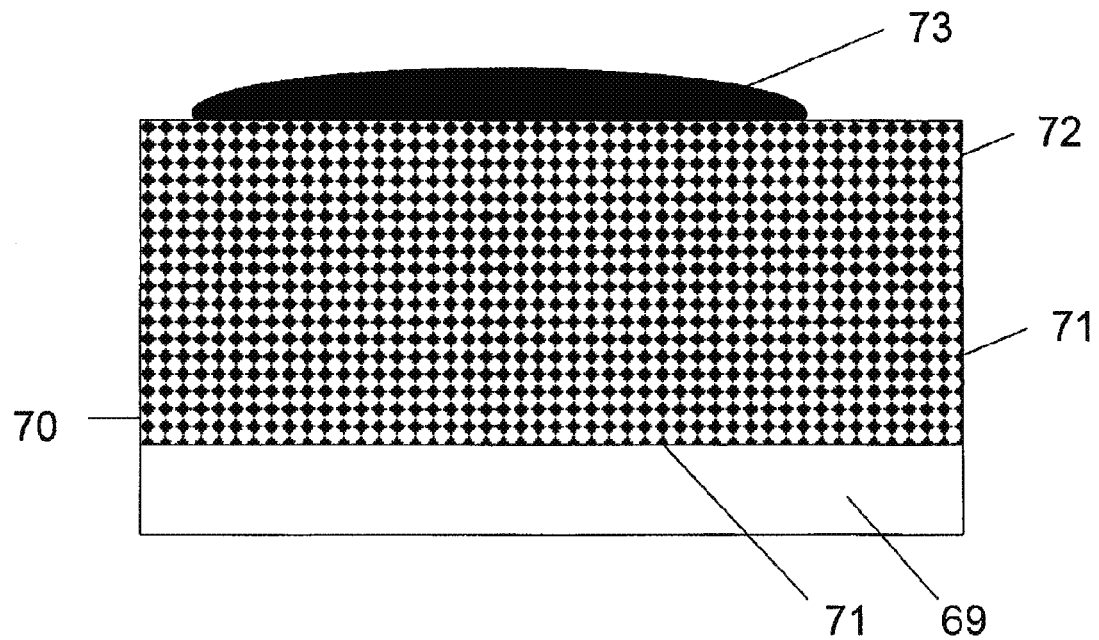
FIG. 15 shows an alternative embodiment of the present invention applied to the fabrication of a low capacitance diode structure with a self-aligned cathode.

The method according to the present invention is applicable to electronic devices other than TFTs. It can be applied to any electronic device which requires alignment of an upper electrode with respect to a previously deposited optically opaque structure on the substrate. An example includes a diode device, such as for example a light-emitting diode, in which the parasitic capacitance between the anode and cathode interconnects needs to be minimized. A possible device structure is shown in FIG. 15. On a substrate 69 an optically opaque electrode structure 70 is defined. In the active area of the device an optically transparent metal such as indium tin oxide is defined, which might act for example as anode for an organic light-emitting diode or photosensing diode. Then an active semiconducting layer 71 such as a light-emitting polymer is deposited. This is followed by deposition of a photosensitive dielectric layer 72, which is patterned by backside light exposure as described above. Upon deposition of a top-gate electrode 73 patterned by any of the techniques described above, such as SAP, a self-aligned cathode for a light-emitting diode can be defined with a low parasitic overlap capacitance with the anode interconnect 70.

Possible materials that may be used for the semiconducting layer, includes any solution processible conjugated polymeric or oligomeric material that exhibits adequate field-effect mobilities exceeding $10^{-3}$ cm$^2$/Vs and preferably exceeding $10^{-2}$ cm$^2$/Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors based on, for example, colloidal nanoparticles (B. A. Ridley, et al., Science 286, 746 (1999)) or inorganic semiconductor nanowires (X. Duan, Nature 425, 274 (2003)). Alternatively, vacuum-deposited semiconductors comprising thin-film, amorphous or polycrystalline silicon can be used.

The gate electrodes may be defined by other additive patterning techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. However, ink-jet printing is considered to be particularly suitable for large area patterning with good registration, in particular for flexible plastic substrates.

Although preferably all layers and components of the device and circuit are deposited and patterned by solution processing and printing techniques, one or more components may also be deposited by vacuum deposition techniques and/or patterned by photolithographic processes.

Figure 17:
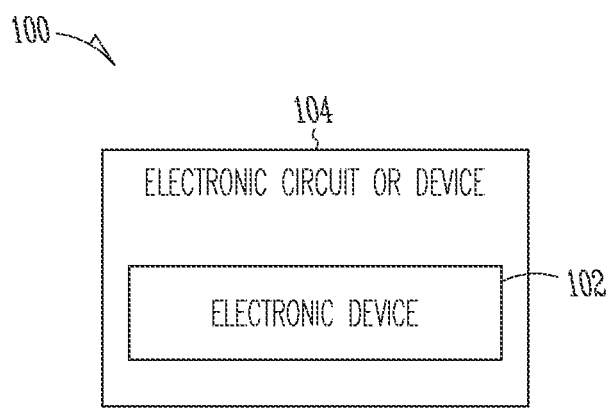
FIG. 17 illustrates a diagram 100 of an electronic device 102 incorporated a part of a more complex circuit or device 104.

FIG. 17 illustrates a diagram 100 of an electronic device 102 incorporated as part of a more complex circuit or device 104. Devices 102 such as TFTs fabricated as described above may be part of more complex circuits or devices 104, in which one or more such devices can be integrated with each other and/or with other devices. Examples of applications include logic circuits and active matrix circuitry for a display or a memory device, or a user-defined gate array circuit.

Patterning processes, as described above, may also be used to pattern other circuitry components, such as, but not limited to, interconnects, resistors and capacitors.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An electronic device comprising:
an optically transparent substrate,
a first electrode structure incorporating a channel, wherein the first electrode structure comprises a source electrode and a drain electrode separated by the channel, the source electrode having a source electrode edge that is adjacent to a first side of the channel, and the drain electrode having a drain electrode edge that is adjacent to a second side of the channel, wherein the source electrode has a thickness of 30-100 nm and is optically opaque across an entire cross-section of the source electrode including being opaque at the source electrode edge, and wherein the drain electrode has a thickness of 30-100 nm and is optically opaque across an entire cross-section of the drain electrode including being opaque at the drain electrode edge, said channel being optically transparent, at least one intermediate layer above the channel and above the first electrode structure, and a photosensitive dielectric layer disposed above the at least one intermediate layer and having a uniform thickness which is significantly greater than the thickness of the at least one intermediate layer and is between 500 nm and 10 μm, the photosensitive dielectric layer incorporating a trench in a region essentially over said channel and including a first side edge and a second side edge and a bottom, wherein the first side edge of the trench is substantial directly above and aligned with the source electrode edge, and wherein the second side edge of the trench is substantially directly above and aligned with the drain electrode edge; and a further electrode, wherein the further electrode is located partially in the trench and partially beyond the trench such that portions of the further electrode within the trench are substantially above the channel but substantially not above the source electrode and substantially not above the drain electrode, and wherein the portions of the further electrode that extend beyond the trench are separated from the at least one intermediate layer by the uniform thickness of the photosensitive dielectric layer.

2. An electronic device according to claim 1 wherein the portions of said further electrode that extend beyond the trench and lie above said first electrode structure comprise an area which is larger than the area of said channel.

3. An electronic device according to claim 1, wherein the at least one intermediate layer has a thickness of between 10-500 nm.

4. An electronic device according to claim 1, wherein the trench significantly thins the photosensitive dielectric layer above the channel.

5. An electronic device according to claim 1, wherein the trench substantially removes the photosensitive dielectric layer above the channel.

6. An electronic device according to claim 1 wherein the photosensitive dielectric layer is a positive photoresist.

7. An electronic device according to claim 1 wherein the channel is less than one micrometer in length.

8. An electronic device according to claim 7 wherein a linewidth of said further electrode is wider than said channel.

9. An electronic device according to claim 8, wherein the at least one intermediate layer is a first dielectric layer.

10. An electronic device according to claim 1, wherein the adhesion of the further electrode to the at least one intermediate layer is different from the adhesion of the further electrode to the photosensitive dielectric layer.

11. An electronic device according to claim 1, wherein the adhesion of the further electrode to the at least one intermediate layer is higher than the adhesion of the further electrode to the photosensitive dielectric layer.

12. An electronic device according to claim 1 wherein the first electrode structure comprises an inorganic metal.

13. An electronic device according to claim 12 wherein the inorganic metal is gold, copper, aluminium, palladium, or nickel.

14. An electronic device according to claim 1 wherein the further electrode fills the trench in the photosensitive dielectric layer.

15. An electronic device according to claim 1 wherein the further electrode comprises inorganic metals.

16. An electronic device according to claim 1 wherein the further electrode is formed by printing of a conducting material.

17. An electronic device according to claim 1 wherein the further electrode is formed by inkjet printing.

18. An electronic device according to claim 1 wherein the further electrode is formed from a nanoparticle metal.

19. An electronic device according to claim 1 wherein the further electrode is formed from a conducting polymer.

20. An electronic device according to claim 1, wherein at least one edge of said trench is aligned with respect to an edge of said channel to within a lateral distance of less than 10 micrometers.

21. An electronic device according to claim 20, wherein the at least one edge of said trench is aligned with respect to an edge of said channel to within a lateral distance of less than 5 micrometers.

22. An electronic device according to claim 21, wherein the at least one edge of said trench is aligned with respect to an edge of said channel to within a lateral distance of less than 1 micrometer.

23. An electronic device according to claim 1 wherein the substrate is a rigid substrate.

24. An electronic device according to claim 1 wherein the at least one intermediate layer comprises a first dielectric layer.

25. An electronic device according to claim 24, wherein the first dielectric layer is formed from a polymer dielectric.

26. An electronic device according to claim 25, wherein the polymer dielectric is polyisobutylene, polyvinylphenol, polymethylmethacrylate (PMMA), parylene or polystyrene (PS).

27. An electronic device according to claim 24, wherein the first dielectric layer is formed from a self-assembled monolayer.

28. An electronic device according to claim 24, wherein the first dielectric layer comprises a multilayer stack.

29. An electronic device according to claim 24, wherein a thickness of the first dielectric layer is less than a channel length.

30. An electronic device according to claim 24, wherein the thickness of the first dielectric layer is less than half the channel length between the first electrode structure.

31. An electronic device according to claim 30, wherein a thickness of the first dielectric layer is less than one fourth a channel length.

32. An electronic device according to claim 1 wherein the at least one intermediate layer comprises a first semiconducting layer.

33. An electronic device according to claim 1 wherein the at least one intermediate layer is less than 1 μm thick.

34. An electronic device according to claim 1, wherein the at least one intermediate layer has a thickness of between 1 to 500 nm.

35. An electronic device according to claim 1 wherein the substrate is a flexible substrate.

36. An electronic device comprising:
a memory device including at least one transistor,
wherein the at least one transistor includes:
an optically transparent substrate,
a first electrode structure incorporating a channel, wherein the first electrode structure comprises a source electrode and a drain electrode separated by the channel, the source electrode having a source electrode edge that is adjacent to a first side of the channel, and the drain electrode having a drain electrode edge that is adjacent to a second side of the channel, wherein the source electrode has a thickness of 30-100 nm and is optically opaque across an entire cross-section of the source electrode including being opaque at the source electrode edge, and wherein the drain electrode has a thickness of 30-100 nm and is optically opaque across an entire cross-section of the drain electrode including being opaque at the drain electrode edge, said channel being optically transparent, at least one intermediate layer above the channel and above the first electrode structure, and a photosensitive dielectric layer disposed above the at least one intermediate layer and having a uniform thickness which is significantly greater than the thickness of the at least one intermediate layer and is between 500 nm and 10 μm, the photosensitive dielectric layer incorporating a trench in a region essentially over said channel and including a first side edge and a second side edge and a bottom, wherein the first side edge of the trench is substantial directly above and aligned with the source electrode edge, and wherein the second side edge of the trench is substantially directly above and aligned with the drain electrode edge, and a further electrode, wherein the further electrode is located partially in the trench and partially beyond the trench such that portions of the further electrode within the trench are substantially above the channel but substantially not above the source electrode and substantially not above the drain electrode, and wherein the portions of the further electrode that extend beyond the trench are separated from the at least one intermediate layer by the uniform thickness of the photosensitive dielectric layer.

\* \* \* \* \*